United States Patent
Chitnis et al.

(10) Patent No.: US 9,024,349 B2
(45) Date of Patent: May 5, 2015

(54) WAFER LEVEL PHOSPHOR COATING METHOD AND DEVICES FABRICATED UTILIZING METHOD

(75) Inventors: Ashay Chitnis, Santa Barbara, CA (US); James Ibbetson, Santa Barbara, CA (US); Arpan Chakraborty, Goleta, CA (US); Eric J. Tarsa, Goleta, CA (US); Bernd Keller, Santa Barbara, CA (US); James Seruto, Orcutt, CA (US); Yankun Fu, Raleigh, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/656,759

(22) Filed: Jan. 22, 2007

(65) Prior Publication Data
US 2008/0173884 A1    Jul. 24, 2008

(51) Int. Cl.
*H01L 33/38* (2010.01)
*H01L 33/62* (2010.01)
(Continued)

(52) U.S. Cl.
CPC .............. *H01L 33/62* (2013.01); *H01L 33/507* (2013.01); *H01L 2924/0002* (2013.01); *H01L 33/38* (2013.01); *H01L 33/508* (2013.01); *H01L 2933/0041* (2013.01); *H01L 33/501* (2013.01); *H01L 33/387* (2013.01); *H01L 23/3114* (2013.01); *H01L 33/44* (2013.01)

(58) Field of Classification Search
CPC .... H01L 33/501; H01L 33/507; H01L 33/387
USPC ...................... 257/88, 98, E25.032, 257/E33.001–E33.043, E33.044–E33.077, 257/81, 82, 99, 100; 438/26, 28, 29
See application file for complete search history.

(56) References Cited

U.S. PATENT DOCUMENTS

| | | |
|---|---|---|
| 3,780,357 A | 12/1973 | Haitz |
| 4,576,796 A | 3/1986 | McCormick |

(Continued)

FOREIGN PATENT DOCUMENTS

| | | |
|---|---|---|
| CN | 2310925 | 3/1999 |
| CN | 2310925 Y | 3/1999 |

(Continued)

OTHER PUBLICATIONS

Office Action re related U.S. Appl. No. 10/666,399, dated: Sep. 5, 2008.

(Continued)

*Primary Examiner* — Kimberly Rizkallah
*Assistant Examiner* — Maria Ligai
(74) *Attorney, Agent, or Firm* — Koppel, Patrick, Heybl & Philpott

(57) ABSTRACT

Methods for fabricating light emitting diode (LED) chips comprising providing a plurality of LEDs typically on a substrate. Pedestals are deposited on the LEDs with each of the pedestals in electrical contact with one of the LEDs. A coating is formed over the LEDs with the coating burying at least some of the pedestals. The coating is then planarized to expose at least some of the buried pedestals while leaving at least some of said coating on said LEDs. The exposed pedestals can then be contacted such as by wire bonds. The present invention discloses similar methods used for fabricating LED chips having LEDs that are flip-chip bonded on a carrier substrate and for fabricating other semiconductor devices. LED chip wafers and LED chips are also disclosed that are fabricated using the disclosed methods.

24 Claims, 11 Drawing Sheets

(51) Int. Cl.
*H01L 33/44* (2010.01)
*H01L 33/50* (2010.01)
*H01L 23/31* (2006.01)

(56) References Cited

U.S. PATENT DOCUMENTS

| | | | | |
|---|---|---|---|---|
| 4,733,335 A | 3/1988 | Serizawa et al. | | 362/503 |
| 4,918,497 A | 4/1990 | Edmond | | 357/17 |
| 4,935,665 A | 6/1990 | Murata | | 313/500 |
| 4,946,547 A | 8/1990 | Palmour et al. | | 156/643 |
| 4,966,862 A | 10/1990 | Edmond | | 437/100 |
| 5,027,168 A | 6/1991 | Edmond | | 357/17 |
| 5,200,022 A | 4/1993 | Kong et al. | | 156/612 |
| 5,210,051 A | 5/1993 | Carter, Jr. | | 437/107 |
| 5,277,840 A | 1/1994 | Osaka et al. | | 252/301.36 |
| 5,338,944 A | 8/1994 | Edmond et al. | | 257/76 |
| RE34,861 E | 2/1995 | Davis et al. | | 437/100 |
| 5,393,993 A | 2/1995 | Edmond et al. | | 257/77 |
| 5,416,342 A | 5/1995 | Edmond et al. | | 257/76 |
| 5,523,589 A | 6/1996 | Edmond et al. | | 257/77 |
| 5,604,135 A | 2/1997 | Edmond et al. | | 437/22 |
| 5,614,131 A | 3/1997 | Mukerji et al. | | 264/1.9 |
| 5,631,190 A | 5/1997 | Negley | | 438/33 |
| 5,739,554 A | 4/1998 | Edmond et al. | | 257/103 |
| 5,766,987 A | 6/1998 | Mitchell et al. | | 438/126 |
| 5,813,753 A | 9/1998 | Vriens et al. | | |
| 5,858,278 A | 1/1999 | Itoh et al. | | 252/301.4 R |
| 5,912,477 A | 6/1999 | Negley | | 257/95 |
| 5,923,053 A | 7/1999 | Jakowetz et al. | | 257/95 |
| 5,959,316 A | 9/1999 | Lowery | | |
| 5,998,925 A | 12/1999 | Shimizu | | 313/503 |
| 6,001,671 A | 12/1999 | Fjelstad | | 438/112 |
| 6,056,421 A | 5/2000 | Johnson et al. | | |
| 6,066,861 A | 5/2000 | Hohn et al. | | |
| 6,069,440 A | 5/2000 | Shimizu et al. | | 313/486 |
| 6,087,202 A | 7/2000 | Exposito et al. | | 438/113 |
| 6,120,600 A | 9/2000 | Edmond et al. | | 117/89 |
| 6,132,072 A | 10/2000 | Turnbull et al. | | 362/494 |
| 6,139,304 A | 10/2000 | Centofante | | 425/121 |
| 6,153,448 A | 11/2000 | Takahashi et al. | | |
| 6,157,086 A | 12/2000 | Weber | | 257/788 |
| 6,187,606 B1 | 2/2001 | Edmond et al. | | 438/46 |
| 6,201,262 B1 | 3/2001 | Edmond et al. | | 257/77 |
| 6,245,259 B1 | 6/2001 | Hohn et al. | | 252/301.36 |
| 6,252,254 B1 | 6/2001 | Soules et al. | | 257/89 |
| 6,257,737 B1 | 7/2001 | Marshall et al. | | |
| 6,274,890 B1 | 8/2001 | Oshio et al. | | |
| 6,329,224 B1 | 12/2001 | Nguyen | | |
| 6,331,063 B1 | 12/2001 | Kamada et al. | | 362/237 |
| 6,333,522 B1* | 12/2001 | Inoue et al. | | 257/99 |
| 6,338,813 B1 | 1/2002 | Hsu et al. | | 264/272.14 |
| 6,366,018 B1 | 4/2002 | Garbuzov | | |
| 6,376,277 B2 | 4/2002 | Corisis | | 438/106 |
| 6,404,125 B1 | 6/2002 | Garbuzov | | 313/499 |
| 6,468,832 B1 | 10/2002 | Mostafazadeh | | 438/112 |
| 6,501,100 B1 | 12/2002 | Srivastava | | |
| 6,504,180 B1 | 1/2003 | Heremans et al. | | |
| 6,522,065 B1 | 2/2003 | Srivastava | | |
| 6,531,328 B1 | 3/2003 | Chen | | 438/26 |
| 6,580,097 B1 | 6/2003 | Soules et al. | | |
| 6,583,444 B2 | 6/2003 | Fjelstad | | 257/82 |
| 6,614,103 B1 | 9/2003 | Durocher et al. | | 257/678 |
| 6,624,058 B1 | 9/2003 | Kazama | | 438/612 |
| 6,642,652 B2 | 11/2003 | Collins, III et al. | | 313/512 |
| 6,650,044 B1 | 11/2003 | Lowery | | 313/502 |
| 6,653,765 B1 | 11/2003 | Levinson et al. | | |
| 6,664,560 B2 | 12/2003 | Emerson et al. | | |
| 6,686,676 B2 | 2/2004 | McNulty et al. | | |
| 6,733,711 B2 | 5/2004 | Durocher et al. | | 264/272.14 |
| 6,734,033 B2 | 5/2004 | Emerson et al. | | |
| 6,744,196 B1* | 6/2004 | Jeon | | 313/498 |
| 6,759,266 B1 | 7/2004 | Hoffman | | 438/64 |
| 6,791,119 B2 | 9/2004 | Slater, Jr. et al. | | 257/99 |
| 6,791,259 B1 | 9/2004 | Stokes | | |
| 6,793,371 B2 | 9/2004 | Lamke et al. | | 362/241 |
| 6,812,500 B2 | 11/2004 | Reeh et al. | | 257/98 |
| 6,853,010 B2 | 2/2005 | Slater, Jr. et al. | | 257/98 |
| 6,860,621 B2 | 3/2005 | Bachl et al. | | 362/373 |
| 6,891,200 B2 | 5/2005 | Nagai et al. | | 257/88 |
| 6,919,683 B1 | 7/2005 | Jang | | 313/503 |
| 6,921,929 B2 | 7/2005 | LeBoeuf et al. | | 257/100 |
| 6,924,233 B1 | 8/2005 | Chua et al. | | |
| 6,936,862 B1 | 8/2005 | Chang et al. | | |
| 6,939,481 B2 | 9/2005 | Srivastava | | |
| 6,958,497 B2 | 10/2005 | Emerson et al. | | 257/94 |
| 6,967,116 B2 | 11/2005 | Negley | | |
| 7,023,019 B2 | 4/2006 | Maeda et al. | | |
| 7,029,935 B2 | 4/2006 | Negley et al. | | |
| 7,042,020 B2 | 5/2006 | Negley | | |
| 7,049,159 B2 | 5/2006 | Lowery | | 438/22 |
| 7,078,737 B2 | 7/2006 | Yuri | | |
| 7,183,586 B2 | 2/2007 | Ichihara | | |
| 7,183,587 B2 | 2/2007 | Negley et al. | | 257/99 |
| 7,202,598 B2 | 4/2007 | Juestel et al. | | 313/503 |
| 7,246,923 B2 | 7/2007 | Conner | | |
| 7,259,402 B2 | 8/2007 | Edmond et al. | | |
| 7,286,296 B2 | 10/2007 | Chaves et al. | | 359/641 |
| 7,566,639 B2 | 7/2009 | Kohda | | 438/463 |
| 7,601,550 B2 | 10/2009 | Bogner | | |
| 7,714,342 B2 | 5/2010 | Lee et al. | | 257/98 |
| 7,714,348 B2 | 5/2010 | Fan et al. | | 257/99 |
| 2001/0000622 A1* | 5/2001 | Reeh et al. | | 257/98 |
| 2001/0007484 A1 | 7/2001 | Sakamaki | | 349/2 |
| 2001/0015442 A1 | 8/2001 | Kondoh et al. | | 257/79 |
| 2001/0019177 A1* | 9/2001 | Sugihara | | 257/780 |
| 2001/0038166 A1 | 11/2001 | Weber | | 264/272 |
| 2002/0001869 A1 | 1/2002 | Fjelstad | | |
| 2002/0006040 A1 | 1/2002 | Kamada et al. | | |
| 2002/0048905 A1 | 4/2002 | Ikegami et al. | | 438/464 |
| 2002/0057057 A1 | 5/2002 | Sorg | | |
| 2002/0063520 A1 | 5/2002 | Yu et al. | | |
| 2002/0070449 A1 | 6/2002 | Yagi et al. | | |
| 2002/0079837 A1 | 6/2002 | Okazaki | | |
| 2002/0088985 A1 | 7/2002 | Komoto et al. | | |
| 2002/0096789 A1 | 7/2002 | Bolken | | |
| 2002/0105266 A1 | 8/2002 | Juestel et al. | | |
| 2002/0123164 A1 | 9/2002 | Slater, Jr. et al. | | |
| 2002/0158578 A1 | 10/2002 | Eliashevich et al. | | 313/512 |
| 2002/0185965 A1 | 12/2002 | Collins, III et al. | | |
| 2002/0195935 A1 | 12/2002 | Jager et al. | | |
| 2003/0006418 A1 | 1/2003 | Emerson et al. | | |
| 2003/0038596 A1 | 2/2003 | Ho | | |
| 2003/0066311 A1 | 4/2003 | Li et al. | | |
| 2003/0079989 A1 | 5/2003 | Klocke et al. | | |
| 2003/0121511 A1 | 7/2003 | Hashimura et al. | | |
| 2003/0160258 A1 | 8/2003 | Oohata | | |
| 2003/0181122 A1 | 9/2003 | Collins et al. | | 445/24 |
| 2003/0207192 A1 | 11/2003 | Pichler et al. | | |
| 2004/0004435 A1 | 1/2004 | Hsu | | |
| 2004/0012958 A1 | 1/2004 | Hashimoto et al. | | |
| 2004/0037949 A1 | 2/2004 | Wright | | |
| 2004/0038442 A1 | 2/2004 | Kinsman | | |
| 2004/0041159 A1* | 3/2004 | Yuri et al. | | 257/79 |
| 2004/0041222 A1 | 3/2004 | Loh | | |
| 2004/0056260 A1 | 3/2004 | Slater et al. | | 257/79 |
| 2004/0061115 A1 | 4/2004 | Kozawa et al. | | |
| 2004/0061433 A1* | 4/2004 | Izuno et al. | | 313/498 |
| 2004/0080939 A1 | 4/2004 | Braddell et al. | | |
| 2004/0106234 A1 | 6/2004 | Sorg et al. | | |
| 2004/0124429 A1 | 7/2004 | Stokes | | |
| 2004/0140765 A1 | 7/2004 | Takekuma | | |
| 2004/0164307 A1 | 8/2004 | Mueller-Mach et al. | | |
| 2004/0164311 A1 | 8/2004 | Uemura | | |
| 2004/0170018 A1 | 9/2004 | Nawashiro | | |
| 2004/0173806 A1 | 9/2004 | Chua | | |
| 2004/0180475 A1 | 9/2004 | Shibata et al. | | 438/127 |
| 2004/0188697 A1* | 9/2004 | Brunner et al. | | 257/99 |
| 2004/0245530 A1* | 12/2004 | Kameyama et al. | | 257/80 |
| 2004/0256974 A1 | 12/2004 | Mueller-Mach et al. | | |
| 2005/0001225 A1 | 1/2005 | Yoshimura et al. | | |
| 2005/0002168 A1 | 1/2005 | Narhi et al. | | |
| 2005/0006651 A1 | 1/2005 | LeBoeuf et al. | | |
| 2005/0051782 A1 | 3/2005 | Negley et al. | | |
| 2005/0062140 A1 | 3/2005 | Leung et al. | | |

(56) References Cited

U.S. PATENT DOCUMENTS

| | | | |
|---|---|---|---|
| 2005/0072981 A1 | 4/2005 | Suenaga | |
| 2005/0093004 A1 | 5/2005 | Yoo | |
| 2005/0122031 A1 | 6/2005 | Itai | |
| 2005/0145991 A1 | 7/2005 | Sakamoto et al. | |
| 2005/0167682 A1 | 8/2005 | Fukasawa | |
| 2005/0184305 A1 | 8/2005 | Ueda | |
| 2005/0184638 A1 | 8/2005 | Mueller | |
| 2005/0194606 A1* | 9/2005 | Oohata | 257/99 |
| 2005/0196886 A1 | 9/2005 | Jager et al. | |
| 2005/0211991 A1 | 9/2005 | Mori et al. | |
| 2005/0219835 A1 | 10/2005 | Nagayama | |
| 2005/0221519 A1 | 10/2005 | Leung et al. | |
| 2005/0243237 A1 | 11/2005 | Sasuga | 349/57 |
| 2005/0253151 A1 | 11/2005 | Sakai et al. | |
| 2005/0259423 A1 | 11/2005 | Heuser et al. | 362/293 |
| 2005/0265404 A1 | 12/2005 | Ashdown | |
| 2005/0269592 A1 | 12/2005 | Lee et al. | 257/100 |
| 2005/0280894 A1 | 12/2005 | Hartkop et al. | |
| 2006/0001046 A1 | 1/2006 | Batres et al. | |
| 2006/0003477 A1* | 1/2006 | Braune et al. | 438/29 |
| 2006/0027820 A1* | 2/2006 | Cao | 257/89 |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0091788 A1 | 5/2006 | Yan | |
| 2006/0102991 A1 | 5/2006 | Sakano | |
| 2006/0124947 A1 | 6/2006 | Mueller et al. | 257/98 |
| 2006/0138937 A1 | 6/2006 | Ibbetson | |
| 2006/0145170 A1* | 7/2006 | Cho | 257/95 |
| 2006/0157721 A1* | 7/2006 | Tran et al. | 257/98 |
| 2006/0163589 A1 | 7/2006 | Fan et al. | |
| 2006/0189098 A1 | 8/2006 | Edmond | |
| 2006/0261292 A1* | 11/2006 | Kim et al. | 250/551 |
| 2006/0267042 A1 | 11/2006 | Izuno | |
| 2006/0284195 A1 | 12/2006 | Nagai | |
| 2007/0001182 A1* | 1/2007 | Schardt et al. | 257/98 |
| 2007/0012940 A1 | 1/2007 | Suh et al. | |
| 2007/0034995 A1 | 2/2007 | Kameyama | |
| 2007/0037307 A1 | 2/2007 | Donofrio | |
| 2007/0092636 A1 | 4/2007 | Thompson et al. | |
| 2007/0096131 A1 | 5/2007 | Chandra | |
| 2007/0114559 A1 | 5/2007 | Sayers et al. | 257/100 |
| 2007/0138941 A1 | 6/2007 | Jin et al. | 313/503 |
| 2007/0158668 A1* | 7/2007 | Tarsa et al. | 257/98 |
| 2007/0158669 A1 | 7/2007 | Lee et al. | |
| 2007/0165403 A1 | 7/2007 | Park | |
| 2007/0215890 A1 | 9/2007 | Harbers | |
| 2007/0257335 A1 | 11/2007 | O'Brien | 257/618 |
| 2007/0259206 A1 | 11/2007 | Oshio | |
| 2007/0278502 A1 | 12/2007 | Shakuda et al. | 257/88 |
| 2008/0006815 A1 | 1/2008 | Wang et al. | |
| 2008/0121911 A1 | 5/2008 | Andrews et al. | 257/98 |
| 2008/0149945 A1 | 6/2008 | Nagai | |
| 2008/0173884 A1 | 7/2008 | Chitnis et al. | 257/98 |
| 2008/0203410 A1 | 8/2008 | Brunner et al. | |
| 2008/0283865 A1 | 11/2008 | Yoo | |
| 2002/0056847 A1 | 3/2009 | Lee et al. | |
| 2009/0086492 A1 | 4/2009 | Meyer | 362/294 |
| 2009/0101930 A1 | 4/2009 | Li | 257/98 |
| 2009/0268461 A1 | 10/2009 | Deak et al. | |
| 2009/0322197 A1 | 12/2009 | Helbing | 313/46 |
| 2012/0043886 A1 | 2/2012 | Ji et al. | 315/51 |

FOREIGN PATENT DOCUMENTS

| | | |
|---|---|---|
| CN | 1372330 A | 10/2002 |
| CN | 1455960 | 11/2003 |
| CN | 1476050 | 2/2004 |
| CN | 1547265 | 11/2004 |
| CN | 1866561 A | 11/2006 |
| DE | 19638667 | 4/1998 |
| DE | 19945672 A1 | 4/2000 |
| DE | 69702929 | 2/2001 |
| DE | 102005000800 | 8/2005 |
| DE | 102005013265 | 12/2005 |
| DE | 102005042814 | 4/2006 |
| DE | 102005062514 | 3/2007 |
| DE | 102005058127 | 6/2007 |
| DE | 102007022090 | 11/2008 |
| EP | 0732740 A2 | 9/1996 |
| EP | 1017112 | 7/2000 |
| EP | 1059678 | 12/2000 |
| EP | 1 138 747 A2 | 10/2001 |
| EP | 1138747 | 10/2001 |
| EP | 1198016 A2 | 10/2001 |
| EP | 1198005 A1 | 4/2002 |
| EP | 1198016 A2 | 4/2002 |
| EP | 1367655 A1 | 3/2003 |
| EP | 1367655 | 12/2003 |
| EP | 1385215 A2 | 1/2004 |
| EP | 1601030 A2 | 11/2005 |
| EP | 1724848 | 11/2006 |
| EP | 1724848 A | 11/2006 |
| EP | 1724848 A2 | 11/2006 |
| EP | 1935452 A1 | 6/2008 |
| FR | 2704690 | 11/1994 |
| FR | 2704690 A | 11/1994 |
| JP | 02-086150 | 3/1990 |
| JP | 402086150 | 3/1990 |
| JP | 4233454 | 8/1992 |
| JP | 10107325 | 4/1998 |
| JP | H10107325 | 4/1998 |
| JP | 10-163525 | 6/1998 |
| JP | 10163525 | 6/1998 |
| JP | 10163525 A | 6/1998 |
| JP | 10247750 A | 9/1998 |
| JP | 10261821 A | 9/1998 |
| JP | H0261821 | 9/1998 |
| JP | 11087778 | 3/1999 |
| JP | 11276932 | 10/1999 |
| JP | 2000002802 | 1/2000 |
| JP | 2002101147 | 4/2000 |
| JP | 2000-164937 A | 6/2000 |
| JP | 2000164930 | 6/2000 |
| JP | 2000164937 | 6/2000 |
| JP | 2000208820 | 7/2000 |
| JP | 2000208820 A | 7/2000 |
| JP | 2000277551 A | 10/2000 |
| JP | 2000-349346 | 12/2000 |
| JP | 2000349346 | 12/2000 |
| JP | 2001308116 A | 11/2001 |
| JP | 2001345480 | 12/2001 |
| JP | 2002009097 A | 1/2002 |
| JP | 2002-050799 | 2/2002 |
| JP | 2002-050799 A | 2/2002 |
| JP | 2002-50799 A | 2/2002 |
| JP | 200250799 | 2/2002 |
| JP | 2002050799 | 2/2002 |
| JP | 2002-076446 | 3/2002 |
| JP | 2002076445 | 3/2002 |
| JP | 2002-118293 * | 4/2002 |
| JP | 2002118293 | 4/2002 |
| JP | 2002118293 A | 4/2002 |
| JP | 2002-531955 | 9/2002 |
| JP | 2002-531956 | 9/2002 |
| JP | 2002261325 | 9/2002 |
| JP | 2002280607 | 9/2002 |
| JP | 2002319704 | 10/2002 |
| JP | 2002374006 | 12/2002 |
| JP | 2003-007929 | 1/2003 |
| JP | 20037929 A | 1/2003 |
| JP | 2003007929 | 1/2003 |
| JP | 2003046141 | 2/2003 |
| JP | 2003-115614 | 4/2003 |
| JP | 2003110153 | 4/2003 |
| JP | 2003115614 | 4/2003 |
| JP | 2003-170465 | 6/2003 |
| JP | 2003-197655 | 7/2003 |
| JP | 2003224307 | 8/2003 |
| JP | 2003234511 | 8/2003 |
| JP | 2003-526212 | 9/2003 |

(56) References Cited

FOREIGN PATENT DOCUMENTS

| | | |
|---|---|---|
| JP | 2003-318448 | 11/2003 |
| JP | 2003-533852 | 11/2003 |
| JP | 2004-031856 | 1/2004 |
| JP | 2004-501512 | 1/2004 |
| JP | 2004031856 | 1/2004 |
| JP | 2004095765 | 3/2004 |
| JP | 2004134699 | 4/2004 |
| JP | 2004186488 | 7/2004 |
| JP | 2004-266240 | 9/2004 |
| JP | 2004266240 | 9/2004 |
| JP | 3589187 B2 | 11/2004 |
| JP | 2004-363342 | 12/2004 |
| JP | 2004363342 | 12/2004 |
| JP | 2005064113 | 3/2005 |
| JP | 2005167079 | 6/2005 |
| JP | 2005-252222 | 9/2005 |
| JP | 2005252222 | 9/2005 |
| JP | 2005298817 | 10/2005 |
| JP | 2006032387 | 2/2006 |
| JP | 2006054209 | 2/2006 |
| JP | 20060495533 | 2/2006 |
| JP | 2006080565 | 3/2006 |
| JP | 2006114637 | 4/2006 |
| JP | 2006165416 | 6/2006 |
| JP | 2006245020 | 6/2006 |
| JP | 2006-245020 | 9/2006 |
| JP | 2006-253370 | 9/2006 |
| JP | 2006253370 | 9/2006 |
| JP | 2006313886 | 11/2006 |
| JP | 2007063538 | 3/2007 |
| JP | 2008-129043 A | 6/2008 |
| JP | 2008532281 | 8/2008 |
| JP | 2008-218511 A | 9/2008 |
| JP | 2000-299334 | 10/2010 |
| KR | 200412776 | 2/2004 |
| KR | 2004-0017926 | 3/2004 |
| KR | 200417926 | 3/2004 |
| KR | 200429313 | 4/2004 |
| TW | 522423 | 1/2003 |
| TW | 522423 | 3/2003 |
| TW | 581325 U | 3/2004 |
| TW | 595012 | 6/2004 |
| WO | WO 00/33390 | 6/2000 |
| WO | WO 0124283 | 4/2001 |
| WO | WO 0124283 A | 4/2001 |
| WO | WO 0124283 A1 | 4/2001 |
| WO | WO 02061847 A2 | 8/2002 |
| WO | WO 03/021668 A1 | 3/2003 |
| WO | WO 03001612 | 3/2003 |
| WO | WO 03021691 A1 | 3/2003 |
| WO | WO 2004020704 | 3/2004 |
| WO | WO 2005101445 A1 | 10/2005 |
| WO | WO 2005101909 | 10/2005 |
| WO | WO 2005121641 A1 | 12/2005 |
| WO | WO 2006033695 A2 | 3/2006 |
| WO | WO 2006036251 A1 | 4/2006 |
| WO | WO 2006/065015 | 6/2006 |
| WO | WO 2006135496 A2 | 12/2006 |
| WO | WO 2007018560 | 2/2007 |
| WO | WO 2007107903 A1 | 9/2007 |
| WO | WO 2007136956 | 11/2007 |
| WO | WO 2008003176 A1 | 1/2008 |
| WO | WO 2009060356 A2 | 5/2009 |
| WO | WO 2010035171 A2 | 4/2010 |

OTHER PUBLICATIONS

International Search Report for PCT/US2007/024367, Dated: Oct. 22, 2008.
PCT Search Report and Written Opinion Oct. 31, 2007, for PCT/US/2007/007600.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
International Materials Reviews "Materials for Field Emission Displays", A.P. Burden 2001.
NPO-30394 Electrophoretic Deposition for Fabricating Microbatteries p. 1-2, NASA Tech Briefs Issue May 3, 2003.
PCT/US2007/024366 Partial International Search Report.
PCT International Search Report and Written Opinion, PCT/US2007/024366,Date: Jul. 15, 2008.
Official Notice of Rejection re related Japanese Patent Application No. 2007-533459, Dated: Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
Japanese Publication No. JP2005033138(A), Date: Feb. 3, 2005 to Shoji Iwao;Fujisawa Shigeo.
Examination of related European Application No. 05 808 825.3-2203, Dated: Mar. 18, 2009.
International Search Report and Written Opinion from related PCT Application No. PCT/US2009/001572, dated: Jul. 17, 2009.
Office Action from related patent U.S. Appl. No. 11/982,276, dated Dec. 7, 2009.
Office Action from related patent U.S. Appl. No. 12/077,638, dated; Dec. 8, 2009.
From related application. Japanese Patent Application No. 2006-526964, Official Notice of Rejection, mailed Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Office Action from U.S. Appl. No. 11/398,214, dated: Dec. 11, 2009.
Response to Office Action from U.S. Appl. No. 11/398,214, filed: Mar. 2, 2010.
Office Action from U.S. Appl. No. 10/666,399, dated: Dec. 22, 2009.
Response to Office Action from U.S. Appl. No. 10/666,399, filed: Mar. 22, 2010.
Office Action from U.S. Appl. No. 12/077,638, dated: Jul. 7, 2010.
Response to Office Action from U.S. Appl. No. 12/077,638, filed Aug. 30, 2010.
Office Action from U.S. Appl. No. 12/077,638, dated: Sep. 22, 2010.
Response to Office Action from U.S. Appl. No. 12/077,638. dated: Sep. 28, 2010.
Office Action from U.S. Appl. No. 12/008,477, dated: Mar. 1, 2010.
Response to Office Action from U.S. Appl. No. 12/008,477, filed May 26, 2010.
Office Action from U.S. Appl. No. 11/982,276, dated: Mar. 25, 2010.
Response to Office Action from U.S. Appl. No. 11/982,276, filed Jun. 21, 2010.
Office Action from U.S. Appl. No. 10/666,399, dated: May 11, 2010.
Response to Office Action from U.S. Appl. No. 10/666,399, filed Aug. 11, 2010.
Office Action from U.S. Appl. No. 11/881,683, dated: May 12, 2010.
Response to Office Action from U.S. Appl. No. 11/881,683, filed Aug. 3, 2010.
Office Action from U.S. Appl. No. 11/595,720. dated: May 14, 2010.
Response to Office Action from U.S. Appl. No. 11/595,720, filed Jul. 7, 2010.
Office Action from U.S. Appl. No. 11/899,790. dated: Jun. 2, 2010.
Office Action from U.S. Appl. No. 12/506,989. dated: Jul. 23, 2010.
Office Action from U.S. Appl. No. 11/982,276. dated Aug. 19, 2010.
Office Action from U.S. Appl. No. 12/008,477, dated: Oct. 7, 2010.
Office Action from U.S. Appl. No. 11/827,626, dated: Oct. 7, 2010.
Office Action from U.S. Appl. No. 11/881,683, dated: Oct. 14, 2010.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
Office Action from Application No. 11/899,790, dated: Jun. 2, 2010.

(56) References Cited

OTHER PUBLICATIONS

Office Action from Japanese Patent Application No. 2007-533459 (Appeal No. 2009-006588) mailed Jul. 16, 2010.
Office Action from Chinese Patent Application No. 200780012387.0 mailed Jun. 30, 2010.
Summons for Oral Proceedings for European Patent Application No. 05808825.3 dated Sep. 9, 2010.
Notification of the First Office Action for counterpart Chinese Patent Application No. 200780050127.2 mailed Aug. 8, 2010.
Notice of Rejection for Japanese Patent Application No. 2006-526964 issued Oct. 5, 2010.
Notification of the First Office Action for counterpart Chinese Patent Application No. 200780050197.8 dated Sep. 9, 2010.
Reexamination Decision No. 27346 for Chinese Patent Application No. 200580031382.3 dated Oct. 27, 2010.
Office Action in Korean Patent Application No. 10-2007-7008694 mailed Aug. 7, 2011.
Response to Office Action from U.S. Appl. No. 11/982,276, filed Mar. 8, 2010.
Response to Office Action from U.S. Appl. No. 12/077,638, filed Feb. 26, 2010.
Response to Office Action from U.S. Appl. No. 11/899,790, filed Jun. 2, 2010.
Response to Office Action from U.S. Appl. No. 11/982,276, filed Nov. 2, 2010.
Office Action from U.S. Appl. No. 11/827,626, dated: Apr. 1, 2011.
Office Action from U.S. Appl. No. 11/899,790, dated: Mar. 21, 2011.
Office Action from U.S. Appl. No. 11/656,759, dated: Mar. 9, 2011.
Office Action from U.S. Appl. No. 12/506,989, dated: Mar. 8, 2011.
Office Action from U.S. Appl. No. 12/077,638, dated: Dec. 21, 2010.
Office Action from U.S. Appl. No. 11/398,214, dated: Nov. 12, 2010.
Notice of Allowance from U.S. Appl. No. 10/666,399, dated: Oct. 14, 2010.
Office Action from U.S. Appl. No. 11/881,683, dated: Feb. 5, 2010.
Office Action from U.S. Appl. No. 11/982,276, dated: Feb. 18, 2010.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action for Taiwan Patent Application No. TW 093128231 issued Apr. 21, 2011.
Second Office Action for counterpart Chinese Patent Application No. 200780050127.2 dated Jun. 15, 2011.
International Preliminary Examination Report for counterpart PCT Application No. PCT/US07/24366 mailed Jun. 29, 2011.
International Preliminary Examination Report for counterpart PCT Application No. PCT/US07/24367 mailed Jun. 29, 2011.
Decision to Refuse a European Patent Application regarding EP 05 808 825.3 dated Jun. 14, 2011.
Office Action U.S. Appl. No. 12/008,477, mailed Sep. 19, 2011.
Response to Office Action U.S. Appl. No. 12/008,477, filed Jan. 25, 2012.
Office Action U.S. Appl. No. 12/862,640, mailed Aug. 19, 2011.
Response to Office Action U.S. Appl. No. 12/862,640, filed Feb. 21, 2012.
Office Action U.S. Appl. No. 12/287,764, mailed Oct. 26, 2011.
Response to Office Action U.S. Appl. No. 12/287,764, filed Mar. 6, 2012.
Office Action U.S. Appl. No. 12/506,989, mailed Dec. 27, 2011.
Office Action U.S. Appl. No. 11/899,790, mailed Jan. 12, 2012.
Response to Office Action U.S. Appl. No. 11/899,790, filed Mar. 8, 2012.
Office Action U.S. Appl. No. 12/862,640, mailed Mar. 9, 2012.
Office Action U.S. Appl. No. 12/287,764, mailed Jan. 13, 2011.
Response to Office Action U.S. Appl. No. 12/287,764, filed May 5, 2011.
Office Action U.S. Appl. No. 12/008,477, mailed Apr. 12, 2011.
Response to Office Action U.S. Appl. No. 12/008,477, filed Jun. 27, 2011.
Office Action U.S. Appl. No. 11/899,790, mailed Jul. 27, 2011.
Response to Office Action U.S. Appl. No. 11/899,790, filed Nov. 22, 2011.
Office Action U.S. Appl. No. 12/506,989, mailed on Jul. 20, 2011.
Response to Office Action U.S. Appl. No. 12/506,989, filed on Nov. 21, 2011.
Office Action U.S. Appl. No. 12/287,764, mailed Jul. 30, 2010.
Response to Office Action U.S. Appl. No. 12/287,764, filed Nov. 30, 2010.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, mailed Mar. 25, 2010.
Response to Office Action U.S. Appl. No. 12/287,764, filed Jul. 21, 2010.
Office Action U.S. Appl. No. 12/287,764, mailed May 17, 2011.
Response to Office Action U.S. Appl. No. 12/287,764, filed Oct. 10, 2011.
Office Action U.S. Appl. No. 13/072,371, mailed Oct. 5, 2011.
Response to Office Action U.S. Appl. No. 13/072,371, filed Dec. 23, 2011.
Examination Report for European Application No. 04 783 941.0-2203, dated Mar. 22, 2012.
Notification of First Office Action from Chinese Application No. 201010279016.21, dated Feb. 28, 2012.
Notification of the Third Office Action from Chinese Application No. 200780050127.2, dated Mar. 28, 2012.
Decision of Rejection from Japanese Application No. 2009-547218, dated Mar. 8, 2012.
Decision of Rejection from Japanese Application No. 2009-547219, dated Mar. 8, 2012.
Extended European Search Report Application No. 10012027.8-2203/2306526, Mar. 30, 2012.
Office Action for Taiwan Patent Application No. 094122646, Feb. 20. 2012.
Examination Report for European Application No. 08 171 399.2-2222. Mar. 26, 2012.
Response to Office Action from related U.S. Appl. No. 12/229,366, OA dated Feb. 28, 2012, response dated Apr. 27, 2012.
Office Action from related U.S. Appl. No. 12/229,366, dated Feb. 28, 2012.
Response to Office Action from related U.S. Appl. No. 12/229.366, OA dated Sep. 19, 2011, response dated Dec. 7, 2011.
Office Action from related U.S. Appl. No. 12/229,366, dated Sep. 19, 2011.
Response to Office Action from related U.S. Appl. No. 12/229,366, OA dated Mar. 16, 2011, response dated Jun. 16, 2011.
Office Action from related U.S. Appl. No. 12/229,366, dated Mar. 16, 2011.
Response to Office Action from related U.S. Appl. No. 12/229,366, OA dated Oct. 22, 2010, response dated Nov. 9, 2010.
Office Action from related U.S. Appl. No. 12/229,366, dated Oct. 22, 2010.
Notice of Results of Re-Consideration Prior to Appeal from Korean Patent Application No. 10-2007-7008694, dated Sep. 21, 2012.
Rejection Decision for Chinese Patent Application No. 201110029365.3, dated Sep. 10, 2012.
Noting of Loss of Rights from European Application No. 04783941.0-2203/1665361, dated Nov. 6, 2012.
Notification of Reasons for Rejection for counterpart Japanese Patent Application No. 2009-547219 dated Sep. 16, 2011.
Notification of Reasons for Rejection for counterpart Japanese Patent Application No. 2009-547218 dated Sep. 16, 2011.
Notice of Rejection of Japanese Patent Application No. 2006-526964 issued Sep. 13, 2011.
Notice of Reasons for Rejection for Japanese Patent Application No. JP 2008-317576 dated Sep. 13, 2011.
Notification of the First Office Action for Chinese Patent Application No. 201110029365.3 mailed Jan. 4, 2012.

(56) References Cited

OTHER PUBLICATIONS

International Search Report and Written Opinion from Application No. PCT/US2011/001214, dated Mar. 21, 2012.
Notification of the First Office Action, Chinese Patent Application No. 201010279016.2, dated: Feb. 28, 2012.
Office Action from Japanese Office Action, Application No. 2011-224055, dated Feb. 7, 2013.
Rejection Decision from Taiwanese Patent Appl. No 094122646, dated Dec. 14, 2012.
Decision of Rejection from Japanese Patent Appl. No. 2008-317576, dated Dec. 18, 2012.
Decision of Rejection from Japanese Patent Appl. No. 2006-526964, dated Dec. 18, 2012.
Second Office Action from Chinese Patent Application No. 20101029016.2, dated Dec. 24, 2012.
Official Action from European Patent Application No. 07874432.3, dated Nov. 13, 2012.
Official Action from European Patent Application No. 07840092.6, dated Nov. 13, 2012.
Notification of Reasons for Rejection for Japanese Patent Appl. No 2011-279356, dated Jan. 23, 2013.
Office Action from Patent U.S. Appl. No. 13/072,371, dated Mar. 29, 2012.
Response to OA from U.S. Appl. No. 13/072,371, filed May 16, 2012.
Office Action from U.S. Appl. No. 12/862,640, dated Jun. 29, 2012.
Response to OA from U.S. Appl. No. 12/862,640, filed Sep. 20, 2012.
Office Action from U.S. Appl. No. 12/506,989, dated Jul. 6, 2012.
Response to OA from U.S. Appl. No. 12/506,989, filed Oct. 11, 2012.
Office Action from U.S. Appl. No. 13/072,371, dated Jul. 23, 2012.
Response to OA from U.S. Appl. No. 13/072,371, filed Oct. 17, 2012.
Office Action from U.S. Appl. No. 12/842,639, dated Aug. 14, 2012.
Response to OA from U.S. Appl. No. 12/842,639, filed Nov. 9, 2012.
Office Action from U.S. Appl. No. 12/862,640, dated Oct. 2, 2012.
Response to OA from U.S. Appl. No. 12/862,640, filed Apr. 17, 2013.
Office Action from U.S. Appl. No. 12/506,984, dated Oct. 24, 2012.
Response to OA from U.S. Appl. No. 12/506,989, filed Dec. 4, 2012.
Office Action from U.S. Appl. No. 11/899,790, dated Dec. 5, 2012.
Response to OA from U.S. Appl. No. 11/899,790, filed Feb. 27, 2013.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 13/272,371, dated Jan. 30, 2013.
Response to OA from U.S. Appl. No. 13/072,371, filed Apr. 22, 2013.
Office Action from U.S. Appl. No. 11/899,790, dated May 1, 2013.
Response to OA from U.S. Appl. No. 11/899,790, filed Jun. 18, 2013.
Office Action from U.S. Appl. No. 13/072,371, dated Apr. 30, 2013.
Office Action from U.S. Appl. No. 12/862,640, dated Apr. 30, 2013.
Office Action from U.S. Appl. No. 12/842,639. dated Mar. 7, 2013.
Response to OA from U.S. Appl. No. 12/842,639, filed Jun. 5, 2013.
Office Action from U.S. Appl. No. 12/506,989, dated Sep. 5, 2013.
Office Action from U.S. Appl. No. 11/899,790, dated Sep. 17, 2013.
Office Action from U.S. Appl. No. 12/008,477, dated Sep. 3, 2013.
Rejection Decision from Chinese Patent Appl. No. 201010279016.2, dated Jun. 21, 2013.
Examination Report from European Patent Appl. No. 04 783 941.0-1555, dated Jul. 25. 2013.
Interrogation from Japanese Patent Appl. No. 2008-317576, dated Jul. 9, 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912, dated Jun. 5, 2013.
Notice of Rejection from Japanese Patent Appl. No. 2008-527912 issued Jun. 14, 2011.
International Preliminary Report on Patentability from Appl. No. PCT/US06/24884 dated: Jun. 12, 2008.
Nichia Corp. White LED, Part No. NSPW312BX, "Specification for Nichia White LED, Model NSW312BS", pp. 1-14, 2004.
Nichia Corp. White LED, Part No. NSPW300BS, Specifications for Nichia White LED, Model NSFW300BS, pp. 1-14, 2004.
Office Action from Japanese Patent Appl. No. 2007-216808, mailed Sep. 6, 2010.
Office Action from Japanese Patent Appl. No. 2011-224055, Jan. 12, 2012.
Decision of Final Rejection from Japanese Patent Appl. No. 2007-216808, dated Jan. 1, 2011.
Office Action from German Patent Appl. No 10 2007 040 841.4-33, dated Sep. 17, 2009.
Office Action from German Patent Appl. No. 10 2007 040 811.2, dated Sep. 17, 2009.
Office Action from Chinese Patent Appl. No. 200701483269, dated Jun. 19, 2009. 2 pages.
Schubert, "Light-Emitting Diodes", Cambridge University Press, 2003, pp. 92-96.
Translation of Office Action from Taiwanese Patent Appl. No. 096143968, dated Feb. 13, 2014.
Decision of Rejection from Japanese Patent appl. No. 2012-02326, dated Apr. 8, 2014.
First Office Action and Search Report from Chinese Patent Appl. No. 2012-10175686.9, dated: Mar. 31, 2014.
Office Action from U.S. Appl. No. 11/899,790, dated Feb. 25, 2014.
Office Action from U.S. Appl. No. 12/506,989, dated Feb. 19, 2014.
Office Action (Brief Description of) from Chinese Patent Appl. No. 201010279016.2, dated Jan. 10, 2014.
IPT's Decision from Korean Patent Appl. No. 10-2007-7008694, dated Dec. 24, 2013.
Office Action from U.S. Appl. No. 12/862,640, dated Dec. 20, 2013.
Office Action from Korean Patent Appl. No. 10-2009-7017405, dated Oct. 23, 2013.
Appeal Decision to Grant a Patent from Japanese Patent No. 2007-506279, dated Oct. 28, 2013.
Office Action from U.S. Appl. No. 13/072,371, dated Nov. 8, 2013.
First Office Action and Search Report from Chinese Patent Application No. 201210030627.2, dated Dec. 3, 2012.
Search Report from Taiwanese Patent Appl. No. 097110195, dated Mar. 12, 2014.
Examination from European Appl No. 04 783 941.0-1552, dated Mar. 6, 2014.
Office Action and Search Report from Taiwanese Patent Appl. No. 101130701, dated Feb. 6, 2014.
Notice of Allowance from Korean Patent Appl. No. 10-2009-7017405, dated: Feb. 18, 2014.
Search Report from Taiwanese Patent appl. No. 096143968, dated: Feb. 17, 2014.
Decision of Rejection from Japanese Patent Appl. No. 2012-026327, dated Apr. 8, 2014.
Brief Summary of Rejection Decision from Chinese Patent Appl. No 201010279016.2 dated Apr. 22, 2014.
Preliminary Report from Japanese Patent Appl. No. 2013-020955 dated Dec. 26, 2013 (received May 8, 2014).
Preliminary Report from Japanese Patent Appl. No. 2013-024242 dated Feb. 26, 2014 (received May 8, 2014).
Office Action from Korean Patent Appl. No. 10-2009-7017407, dated Apr. 28, 2014.
Notification of Reexamination from Chinese Patent appl. No. 201110029365.3 dated May 7, 2014.
Notification of Reexamination from Chinese Patent Appl. No. 200780050127.2, dated Jun. 3, 2014.
Office Action and Search Report from Taiwan Patent Appl. No. 097110195, dated Jul. 18, 2014.
Notification of Allowance from Taiwan Patent Appl. No. 101130701, dated Jul. 15, 2014.
Office Action from U.S. Appl. No. 11/899,790, dated Jun. 25, 2014.
Fourth Examination from European Patent Appl. No. 04 783 941.0-1552, dated Oct. 7, 2014.
Summons to attend oral proceedings from European Patent Appl. No. 411.52.106724/0, dated Sep. 9, 2014.
Preliminary Examination Report from Japanese Appl. No. 2012-026326, dated Oct. 1, 2014.
Third Office Action from Chinese Appl. No. 201210175686.9, dated Dec. 11, 2014.

(56) References Cited

OTHER PUBLICATIONS

Office Action from U.S. Appl. No. 12/862,640, dated Oct. 17, 2014.
Letter regarding unfavorable decision on appeal from Japanese Appl. No. 2011-279356, dated Nov. 12, 2014.
Office Action from Taiwanese Patent Appl. No. 097110195, dated Sep. 9, 2014.
Board Decision from Chinese Patent Appl. No. 201110029365.3, dated Aug. 13, 2014.
Second Office Action from Chinese Patent Appl. No. 201210175686.9, dated Sep. 3, 2014.
Office Action from U.S. Appl. No. 12/842,639, dated Aug. 6, 2014.
Office Action from U.S. Appl. No. 12/506,989, dated Aug. 8, 2014.
Office Action from U.S. Appl. No. 13/017,845, dated Sep. 11, 2014.

* cited by examiner

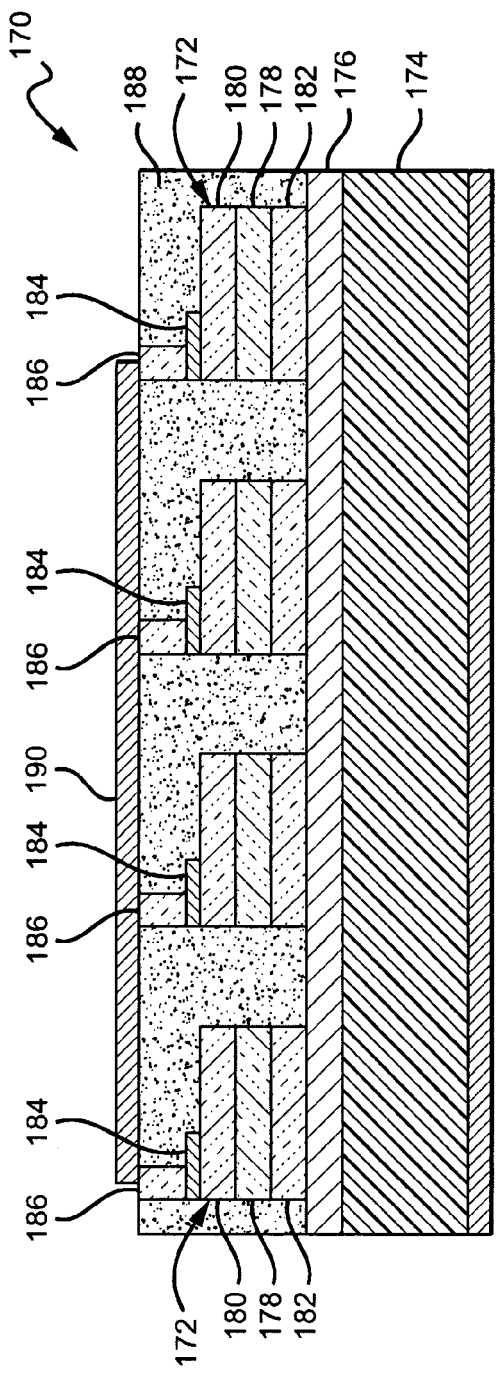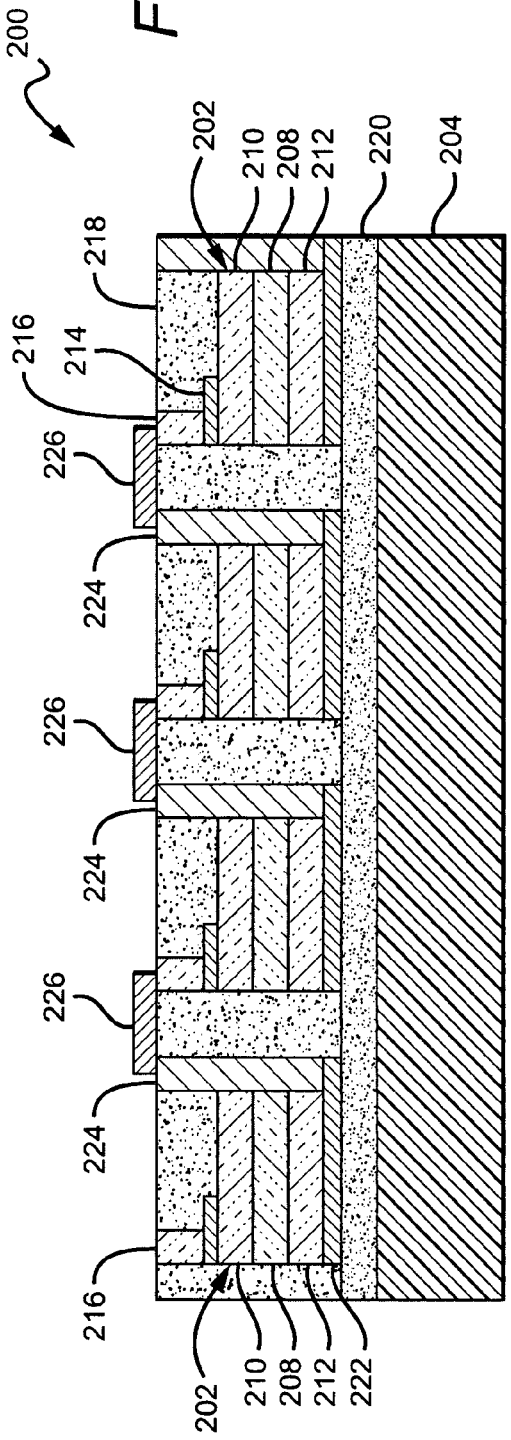

WAFER LEVEL PHOSPHOR COATING METHOD AND DEVICES FABRICATED UTILIZING METHOD

This invention was made with Government support under Contract USAF 05-2-5507. The Government has certain rights in this invention

BACKGROUND OF THE INVENTION

1. Field of the Invention

This invention relates to methods for fabricating semiconductor devices and in particular methods for wafer level coating of light emitting diodes.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

With these approaches the key challenge is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers, and resist strippers. This can limit the options and choices for the particular silicones and process steps. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

SUMMARY OF THE INVENTION

The present invention discloses new methods for fabricating semiconductor devices such as LED chips at the wafer level, and discloses LED chips and LED chip wafers fabricated using the methods. One method for fabricating light emitting diode (LED) chips according to the present invention comprises providing a plurality of LEDs typically on a substrate. Pedestals are formed on the LEDs with each of the pedestals in electrical contact with one of the LEDs. A coating is formed over said LEDs, with the coating burying at least some of the pedestals. The coating is then planarized leaving some of said coating material on said LEDs while exposing at least some of the buried pedestals, making them available for contacting. The present invention discloses similar methods used for fabricating LED chips comprising LEDs flip chip mounted on a carrier substrate. Similar methods according to the present invention can also be used for fabricating other semiconductor devices.

One embodiment of a light emitting diode (LED) chip wafer fabricated using methods according to the present invention comprises a plurality of LEDs on a substrate wafer and a plurality of pedestals, each of which is in electrical contact with one of the LEDs. A coating at least partially covers the LEDs with at least some of the pedestals extending through and to the surface of the coating. The pedestals are exposed at the surface of the coating.

One embodiment of a light emitting diode (LED) chip manufactured using methods according to the present invention comprises an LED on a substrate and a pedestal in electrical contact with the LED. A coating at least partially covering the LED, with the pedestal extending through and to the surface of the coating and exposed at the surface of the coating.

In accordance with certain aspects of the present invention, the coating can include phosphor particles that downconvert at least some of the light emitted from the active region of the LED chip to produce white light, thereby producing a white LED chip.

These and other aspects and advantages of the invention will become apparent from the following detailed description and the accompanying drawings which illustrate by way of example the features of the invention.

BRIEF DESCRIPTION OF THE DRAWINGS

FIG. 9 is a sectional view of one embodiment of an LED array according to the present invention;

FIG. 10 is a sectional view of another embodiment of an LED array according to the present invention;

DETAILED DESCRIPTION OF THE INVENTION

Figure 1A:
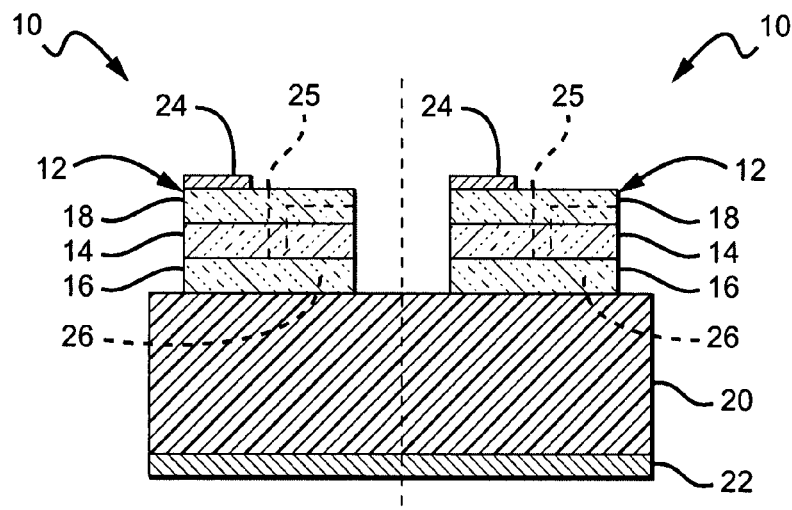
FIGS. 1a through 1e are sectional views of one embodiment of an LED chip wafer at fabrication steps in one method according to the present invention.

The present invention provides fabrication methods that are particularly applicable to wafer level coating of semiconductor devices such as LEDs. The present invention also provides semiconductor devices, such as LEDs fabricated using these methods. The present invention allows coating of LEDs at the wafer level with a down-converter layer (e.g. phosphor loaded silicone) while still allowing access to one or more of the contacts for wire bonding. According to one aspect of the present invention, electrically conducting pedestals/posts are formed on one or both of the LED contacts (bond pads) while the LEDs are at the wafer level. These pedestals can be fabricated using known techniques such as electroplating, electroless plating, stud bumping, or vacuum deposition. The wafer can then be blanket coated with a down-converter coating layer, burying the LEDs, contacts and pedestals. Each of the pedestals act as a vertical extension of its contact, and although the blanket coating with the down-converter coating temporarily covers the pedestals, the coating can be planarized and thinned to expose the top surface or top portion of the pedestals. The pedestals should be tall enough (10-100 μm) to project through the desired final coating thickness. After planarizing the pedestals are exposed for external connection such as by wire bonding. This process occurs at the wafer level and as a subsequent fabrication step, the individual LEDs chips can be separated/singulated from the wafer using known processes.

The present invention eliminates complex wafer fabrication processes to access wire bond pads after blanket coating. Instead a simple and cost effective approach is utilized. It allows for wafer level coating of semiconductor devices without the need for alignment. A wide variety of coating technologies can be used such as spin-coating of phosphor loaded silicone mixture, or electrophoretic deposition of phosphor followed by blanket coating of silicone or other binding material. Mechanical planarization allows thickness uniformity over the wafer and thickness uniformity of the coat can be achieved over a wide thickness range (e.g. 1 to 100 μm). White LED chip color point may be fine tuned by controlling the final coat thickness, including using an iterative approach (e.g. grind, test, grind, etc.) which will result in tightly binned white LEDs. This approach is also scalable to large wafer sizes.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs. A coating can include no phosphors, one or more phosphors, scattering particles and/or other materials. A coating may also comprise a material such as an organic dye the provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1B:
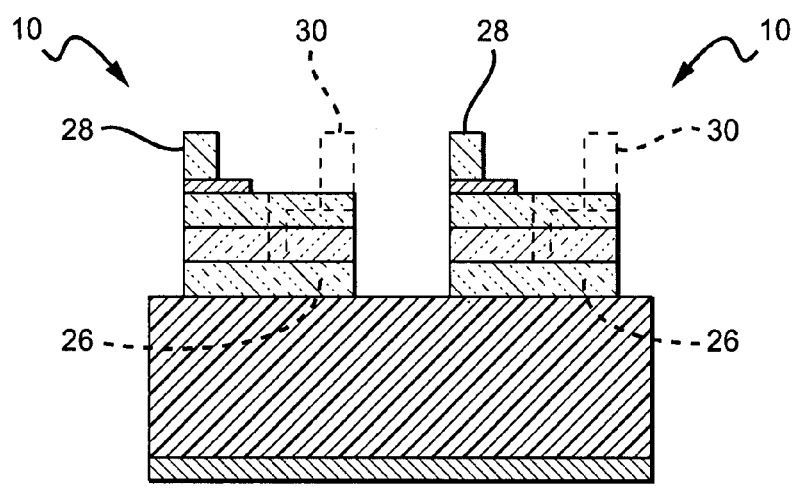
Figure 1C:
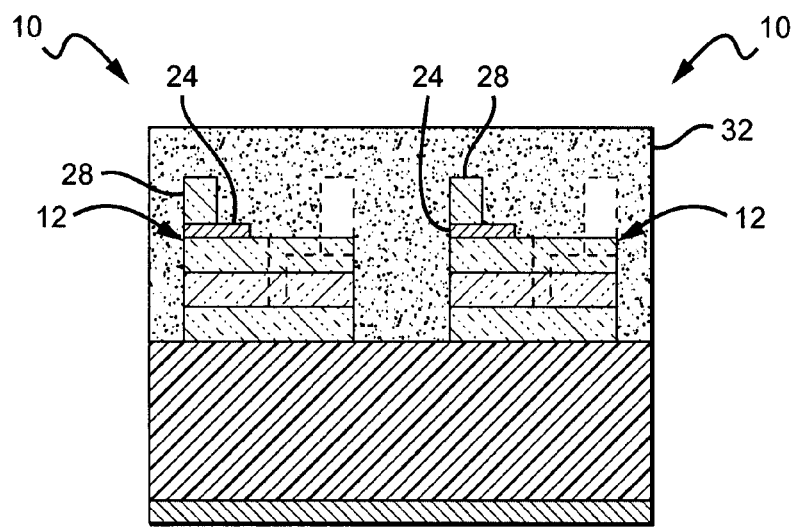
Figure 1D:
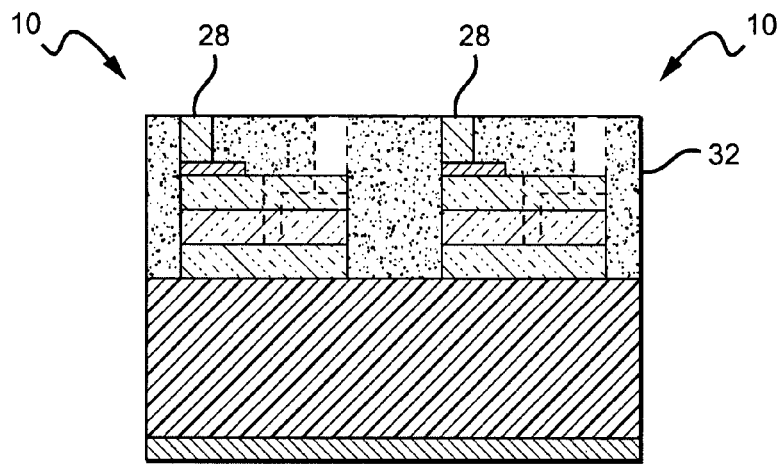
Figure 1E:
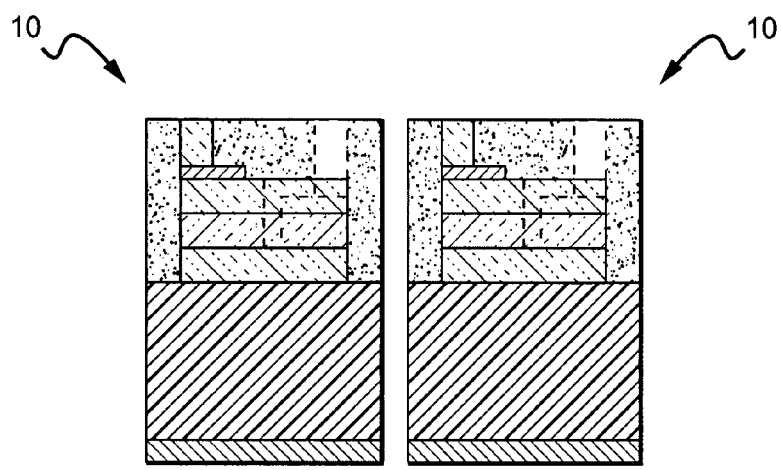

FIGS. 1a through 1e show one embodiment of wafer level LED chips 10 manufactured using a method according to the present invention. Referring now to FIG. 1a, the LEDs chips 10 are shown at a wafer level of their fabrication process. That is, the LEDs chips 10 have not been through all the steps necessary before being separated/singulated from wafer into individual LED chips. Phantom lines are included to show separation or dicing line between the LED chips 10 and following additional fabrication steps, and as shown in FIG. 1e the LEDs chips can be separated into individual devices. FIGS. 1a through 1e also show only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 10 comprises a semiconductor LED 12 that can have many different semiconductor layers arranged in different ways. The fabrication and operation of LEDs is generally known in the art and only briefly discussed herein. The layers of the LED 10 can be fabricated using known processes with a suitable process being fabrication using metal organic chemical vapor deposition (MOCVD). The layers of the LEDs 12 generally comprise an active layer/region 14 sandwiched between first and second oppositely doped epitaxial layers 16, 18, all of which are formed successively on a substrate 20. In this embodiment the LEDs 12 are shown as separate devices on the substrate 20. This separation can be achieved by having portions of the active region 14 and doped layers 16, 18 etched down to the substrate 20 to form the open areas between the LEDs 12. In other embodiments and as described in more detail below, the active layer 14 and doped layers 16, 18 can remain continuous layers on the substrate 20 and can be separated into individual devices when the LED chips are singulated.

It is understood that additional layers and elements can also be included in the LED 12, including but not limited to buffer, nucleation, contact and current spreading layers as well as light extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

The region 14 and layers 16, 18 of the LEDs 12 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers 16, 18 are gallium nitride (GaN) and the active region 14 is InGaN. In alternative embodiments the n- and p-type layers 16, 18 may be AlGaN, aluminum gallium arsenide (AlGaAs) or aluminum gallium indium arsenide phosphide (AlGaInAsP).

The substrate 20 can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 20 is at the wafer level, with the plurality of LEDs 12 formed on the wafer substrate 20.

Each of the LEDs 12 can have first and second contacts 22, 24. In the embodiment shown, the LEDs have a vertical geometry with the first contact 22 on the substrate 20 and the second contact 24 on the p-type layer 18. The first contact 22 is shown as one layer on the substrate, but when the LED chips are singulated from the wafer the first contact 22 will also be separated such that each LED chip 10 has its own portion of the first contact 22. An electrical signal applied to the first contact 22 spreads into the n-type layer 16 and a signal applied to the second contact 24 spreads into the p-type layer 18. In the case of Group-III nitride devices, it is well known that a thin semitransparent current spreading layer typically covers some or all of the p-type layer 18. It is understood that the second contact 24 can include such a layer which is typically a metal such as platinum (Pt) or a transparent conductive oxide such as indium tin oxide (ITO). The first and second contacts 22, 24 are hereinafter referred to as the n-type and p-type contacts respectively.

The present invention can also be used with LEDs having lateral geometry wherein both contacts are on the top of the LEDs. A portion of the p-type layer 18 and active region is removed, such as by etching to expose a contact mesa on the n-type layer 16. The boundary of the removed portion of the of the active region 14 and p-type layer 18 is designated by vertical phantom line 25. A second lateral n-type contact 26 (also shown in phantom) is provided on the mesa of the n-type layer 16. The contacts can comprise known materials deposited using known deposition techniques.

Referring now to FIG. 1b, and according to the present invention, a p-type contact pedestal 28 is formed on the p-type contact 24 that is utilized to make electrical contact to the p-type contact 24 after coating of the LEDs 12. The pedestal 28 can be formed of many different electrically conductive materials and can be formed using many different known physical or chemical deposition processes such as electroplating, electroless plating, or stud bumping, with the preferred contact pedestal being gold (Au) and formed using stud bumping. This method is typically the easiest and most cost effective approach. The pedestal 28 can be made of other conductive materials beyond Au, such as copper (Cu) or nickel (Ni) or Indium, or combinations thereof.

The process of forming stud bumps is generally known and only discussed briefly herein. Stud bumps are placed on the contacts (bond pads) through a modification of the "ball bonding" process used in conventional wire bonding. In ball bonding, the tip of the bond wire is melted to form a sphere. The wire bonding tool presses this sphere against the contact, applying mechanical force, heat, and/or ultrasonic energy to create a metallic connection. The wire bonding tool next extends the gold wire to the connection pad on the board, substrate, or lead frame, and makes a "stitch" bond to that pad, and finishes by breaking off the bond wire to begin another cycle. For stud bumping, the first ball bond is made as described, but the wire is then broken close above the ball. The resulting gold ball, or "stud bump" remains on the contact and provides a permanent, reliable connection through to the underlying contact metal. The stud bumps can then be flattened (or "coined") by mechanical pressure to provide a flatter top surface and more uniform bump heights, while at the same time pressing any remaining wire into the ball.

The height of the pedestal 28 can vary depending on the desired thickness of the phosphor loaded binder coating and should be high enough to match or extend above the top surface of the phosphor loaded binder coating from the LED. The height can exceed 200 µm, with typical pedestal height in the range of 20 to 60 µm. In some embodiments, more than one stud bump can be stacked to achieve the desired pedestal height. The stud bumps or other forms of the pedestal 28 can also have a reflecting layer or can be made of a reflective material to minimize optical losses.

For the vertical geometry type LEDs 12 shown, only one pedestal 28 is needed for the p-type contact 24. For alternative lateral geometry LEDs a second n-type pedestal 30 (shown in phantom) is formed on the lateral geometry n-type contact 26, typically of the same materials, to substantially the same height as the p-type pedestal 28, and formed using the same processes.

Referring now to FIG. 1c, the wafer is blanketed by a phosphor/binder coating 32 that covers each of the LEDs 12, and its contact 22, and has a thickness such that it covers/buries the pedestal 28. For lateral geometry devices, the contact 26 and pedestal 30 are also buried. The present invention provides the advantage of depositing the phosphor coating over the LEDs 12 at the wafer level without the need for alignment over particular devices or features. Instead, the entire wafer is covered, which provides for a simpler and more cost effective fabrication process. The phosphor coating can be applied using different processes such as spin coating, electrophoretic deposition, electrostatic deposition, printing, jet printing or screen printing.

In a preferred embodiment, the phosphor can be deposited over the wafer in a phosphor/binder mixture using spin coating. Spin coating is generally known in the art and generally comprises depositing the desired amount of binder and phosphor mixture at the center of the substrate and spinning the substrate at high speed. The centrifugal acceleration causes the mixture to spread to and eventually off the edge of the substrate. Final layer thickness and other properties depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In another embodiment, the phosphor is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the coating 32. The binder coating can be applied using many known methods and in one embodiment, the binder coating can be applied using spin coating.

The phosphor/binder coating 32 can then be cured using many different curing methods depending on different factors such as the type of binder used. Different curing methods include but are not limited to heat, ultraviolet (UV), infrared (IR) or air curing.

Different factors determine the amount of LED light that will be absorbed by the phosphor/binder coating in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Different materials can be used for the binder, with materials preferably being robust after curing and substantially transparent in the visible wavelength spectrum. Suitable material include silicones, epoxies, glass, spin-on glass, BCB, polymides and polymers, with the preferred material being silicone because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction.

Many different phosphors can be used in the coating 32 according to the present invention. The present invention is particularly adapted to LED chips emitting white light. In one embodiment according to the present invention LEDs 12 emit light in the blue wavelength spectrum and the phosphor absorbs some of the blue light and re-emits yellow. The LED chips 10 emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors used as conversion particles in an LED chips 10, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4$:Eu
$Ba_2SiO_4:Eu^{2+}$ Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ Different sized phosphor particles can be used including but not limited to 10-100 nanometer (nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm. In other embodiments, the coating 32 can comprise different types of phosphors or can comprise multiple phosphor coatings for monochromatic or polychromatic light sources.

The coating 32 can also have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations or types of phosphors, or a first coat of clear silicone can be deposited followed by phosphor loaded layers.

As discussed above, the pedestal 28 (and pedestal 30 for lateral devices) are buried by the coating 32, which allows for the LED chips 10 to be coated without the need for alignment. After the initial coating of the LED chips, further processing is needed to expose the pedestal 28. Referring now the FIG. 1d, the coating 32 is thinned or planarized so that the pedestals 28 are exposed through the coating's top surface. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The thinning process not only exposes the pedestals, but also allows for planarizing of the coating and for control of the final thickness of the coating.

Following planarization, the surface root mean squared roughness of the coating should be approximately 10 nm or less, although the surface can have other surface roughness measurements. In some embodiments the surface can be textured during planarization. In other embodiments, after planarization the coating or other surfaces, can be textured such as by laser texturing, mechanical shaping, etching (chemical or plasma), or other processes, to enhance light extraction. Texturing results in surface features that are 0.1-5 μm tall or deep, and preferably 0.2-1 μm. In other embodiments, the surface of the LEDs 12 can also be textured or shaped for improved light extraction.

Referring now to FIG. 1e, the individual LED chips 10 can be singulated from the wafer using known methods such as dicing, scribe and breaking, or etching. The singulating process separates each of the LED chips 10 with each having substantially the same thickness of coating 32, and as a result, substantially the same amount of phosphor and emission characteristics. This allows for reliable and consistent fabrication of LED chips 10 having similar emission characteristics. Following singulating the LED chips can be mounted in a package, or to a submount or printed circuit board (PCB) without the need for further processing to add phosphor. In one embodiment the package/submount/PCB can have conventional package leads with the pedestals electrically connected to the leads. A conventional encapsulation can then surround the LED chip and electrical connections. In another embodiment, the LED chip can be enclosed by a hermetically sealed cover with an inert atmosphere surrounding the LED chip at or below atmospheric pressure.

For the LED chips 10, light from the LED 12 that is emitted toward substrate 20 can pass out of the LED chip 10 through the substrate without passing through the phosphor/binder coating 32. This can be acceptable for generating certain colors or hues of light. In embodiments where this substrate emission is to be prevented or minimized, the substrate 20 can be opaque so that light from the LED 12 emitted toward the substrate 20 is blocked or absorbed so that most light emitting from the LED chip 10 comes from light passing through the coating 32.

Figure 2:
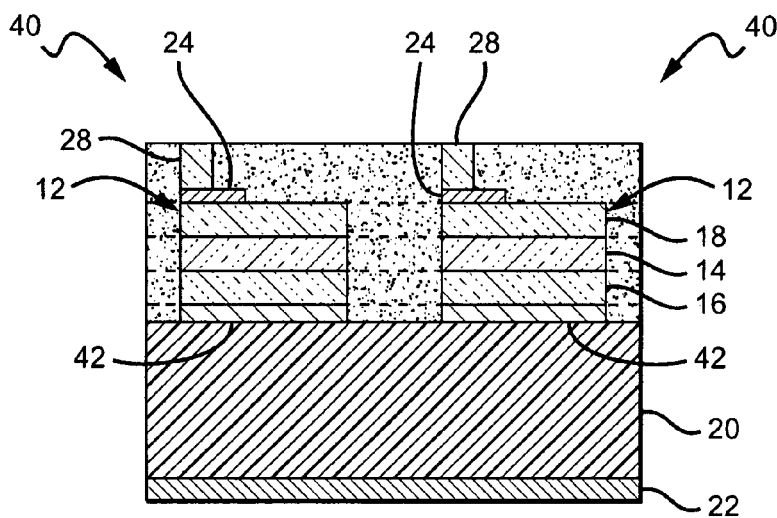
FIG. 2 is a sectional view of another embodiment of an LED chip wafer according to the present invention having a reflective layer.

FIG. 2 shows anther embodiment of a LED chips 40 that are similar to the LED chips 10 described above and shown in FIGS. 1a through 1e, but having additional features to encourage emission of LED chip light toward the top of the LED chips 40 and minimize light passing into the substrate 20. For similar features as those in LED chips 10, the same reference numbers will be used herein. Each of the LED chips 40 comprises LEDs 12 formed on a substrate 20 and having n-type layer 16, active region 14 and p-type layer 18 formed successively on the substrate 20. LED chips 40 further comprise n-type contact 22, p-type contact 24, p-type pedestal 28 and coating 32. The coating 32 is planarized to expose the pedestal 28. The LED chips 40 can alternatively have lateral geometry with the additional pedestal 30

LED chips 40 also comprise a reflective layer 42 that is arranged to reflect light emitted from the active region toward the substrate 20, back toward the top of the LED chips 40. This reflective layer 42 reduces the emission of light from the LEDs 12 that does not pass through conversion material before emitting from the LED chips 40, such as through the substrate 20 and encourages emission toward the top of the LED chips 40 and through the coating 32.

The reflective layer 42 can be arranged in different ways and in different locations in the LED chip 40, with the layer 42 as shown arranged between the n-type layer 16 and the substrate 20. The layer can also extend on the substrate 20 beyond the vertical edge of the LED chips 12. In other embodiments the reflective layer is only between the n-type layer 16 and the substrate. The layer 42 can comprise different materials including but not limited to a metal or a semiconductor reflector such as a distributed Bragg reflector (DBR).

As mentioned above, in some embodiments the active region 14 and the n- and p-type layers 16, 18 can be continuous layers on the substrate 20 as shown by phantom lines between the LEDs 12. In these embodiments, the LEDs are not separated until the step when the LED chips 40 are singulated. Accordingly, the resulting LED chips may have a layer of the coating 32 over the top surface of the LEDs. This can allow for emission of the active region light out the side surfaces of the LEDs 12, but in embodiments utilizing this LEDs in relation to the surrounding features, this emission of light without encountering phosphor material can be minimal compared to the amount of light passing through the phosphor material.

Figure 3A:
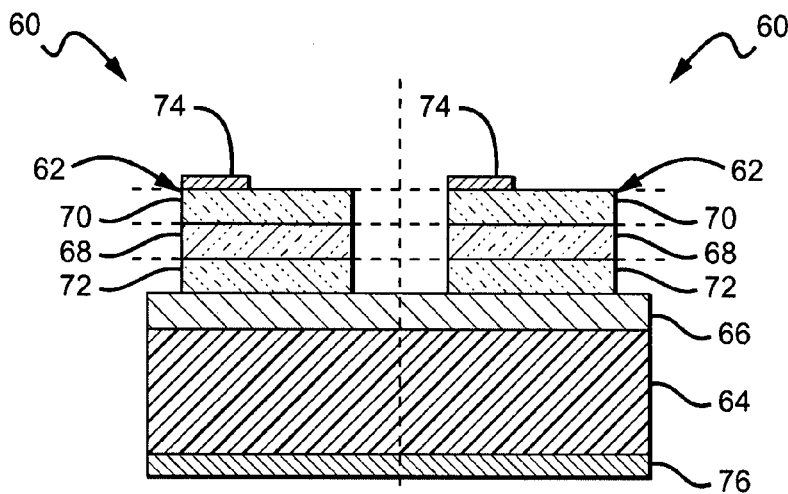
FIGS. 3a through 3e are sectional views of one embodiment of an flip-wafer bonded LED chip wafer at fabrication steps in another method according to the present invention.

The methods according to the present invention can be used to coat many different devices and LEDs. FIGS. 3a through 3e show a different LED chip 60 having a structure different from the LED chip 10 described above and shown in FIGS. 1a through 1e. Referring first to FIG. 3a, the LED chip 60 is also at wafer level and shown prior to singulating. It comprises LEDs 62 that are not on a growth substrate, but are instead flip-wafer bonded to a carrier substrate 64. In this embodiment, the growth substrate can comprise the materials described above for growth substrate 20 in FIGS. 1a through 1e, but in this embodiment the growth substrate is removed after (or before) flip-wafer bonding, with the substrate removed using known grinding and/or etching processes. The LEDs 62 are mounted to the carrier substrate 64 by layer 66, which is typically one or more bond/metal layers, and which also serve to reflect light incident on it. In other embodiments, the growth substrate or at least portions thereof remain. The growth substrate or the remaining portions can be shaped or textured to enhance light extraction from the LEDs 62.

Many different material systems can be used for the LEDs, with a preferred material system being the Group-III nitride material system grown using known processes as described above. Like the LEDs 12 in FIGS. 1a-1e, each of the LEDs 62 generally comprises an active region 68 sandwiched between n-type and p-type epitaxial layers 70, 72 although other layers can also be included. Because LEDs 62 are flip-wafer bonded, the top layer is the n-type layer 70, while the p-type layer 72 is the bottom layer arranged between the active region 68 and the bond/metal layer 66. The carrier substrate can be many different known materials, with a suitable material being silicon.

For vertical geometry LED chips 60, an n-type contact 74 can be included on top surface of each of the LEDs, and a p-type contact 76 can be formed on the carrier substrate 64. The n- and p-type contacts 74, 76 can also be made of conventional conductive materials deposited using known techniques similar to the first and second contacts 22, 24 shown in FIGS. 1a through 1e and described above. As also described above, the LEDs can have a lateral geometry with the n- and p-type contacts on the top of the LEDs.

Figure 3B:
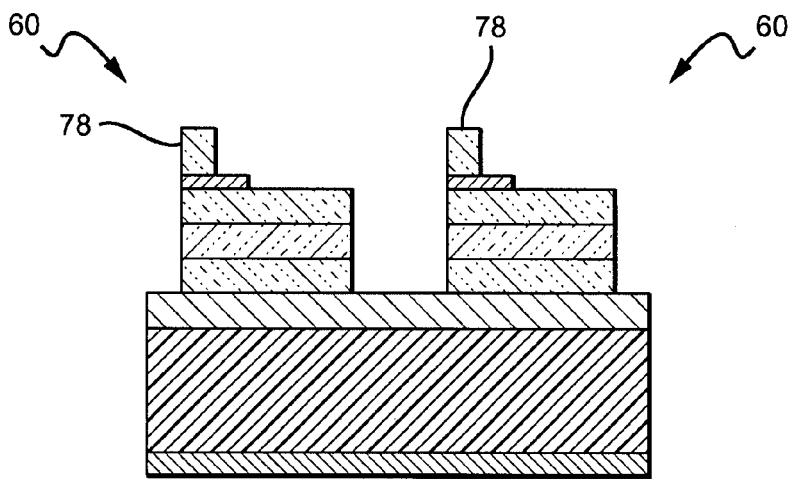
Figure 3C:
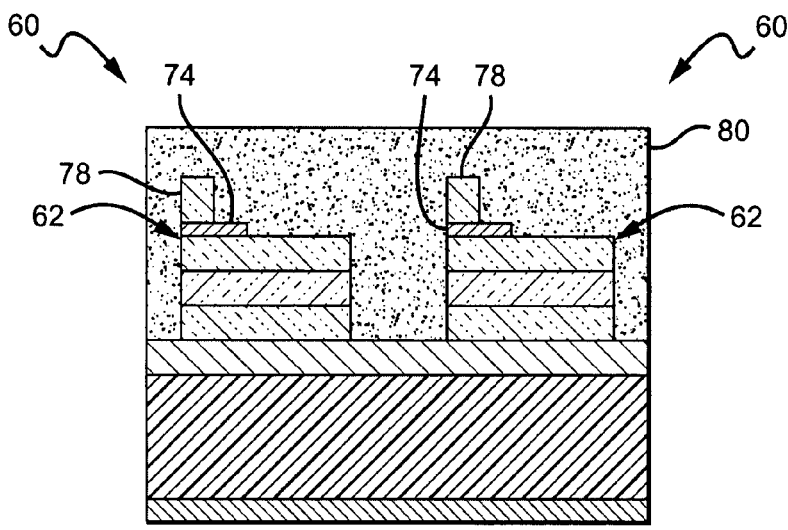

Referring now to FIG. 3b, each of the LED chips 60 can have a pedestal 78 formed on its first contact 70, with each pedestal being formed of the same material and using the same methods as those described above for pedestal 28 in FIGS. 1b through 1e. As shown in FIG. 3c the LED chip wafer can then be covered by a blanket coating 80 preferably comprising a phosphor loaded binder. The same phosphors and binder can be used as those for the coating 32 described above and shown in FIGS. 1c through 1e, and can be deposited using the same methods. The coating 80 covers and buries the LEDs 62, their first contacts 74 and the pedestals 78, with the coating 80 being deposited without alignment steps.

Figure 3D:
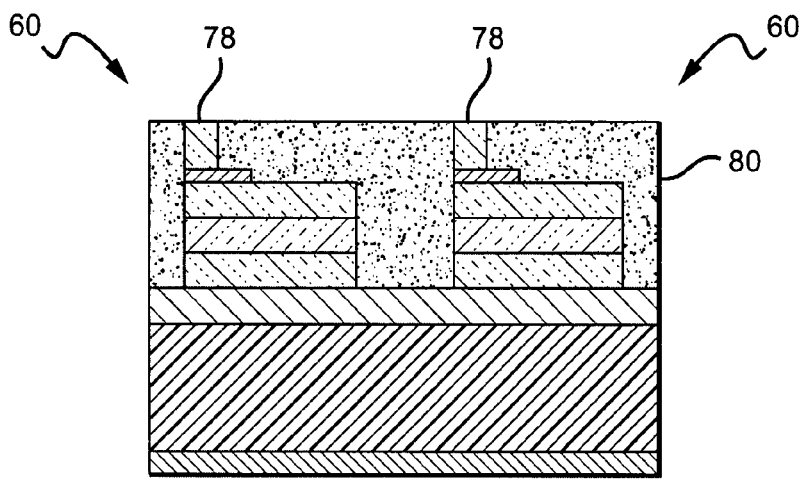
Figure 3E:
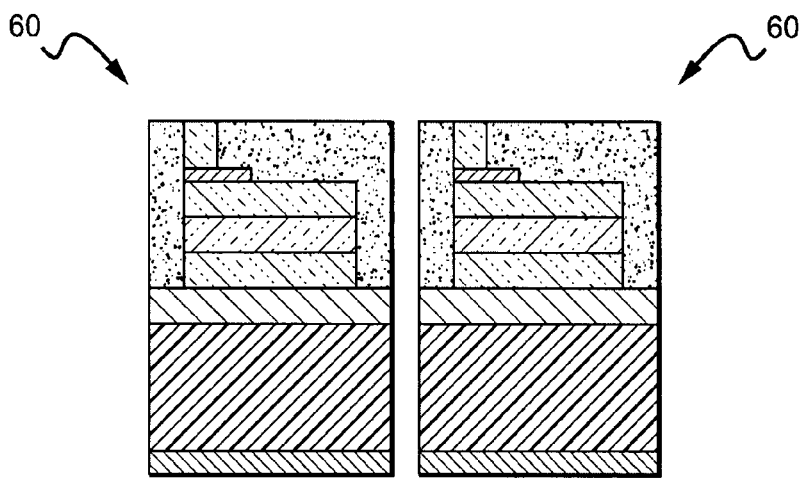

Referring now to FIG. 3d, the coating 80 can be planarized or thinned to expose the pedestals 78 and to control thickness of the coating 80 using the methods described above. Referring now to FIG. 3e, the individual LED chips 60 can be singulated from the wafer using the methods described above. These devices can then be packaged or mounted to a submount or PCB. In other embodiments the carrier substrate can be removed, leaving a coated LED that can then be packaged or mounted to a submount or PCB.

Figure 4:
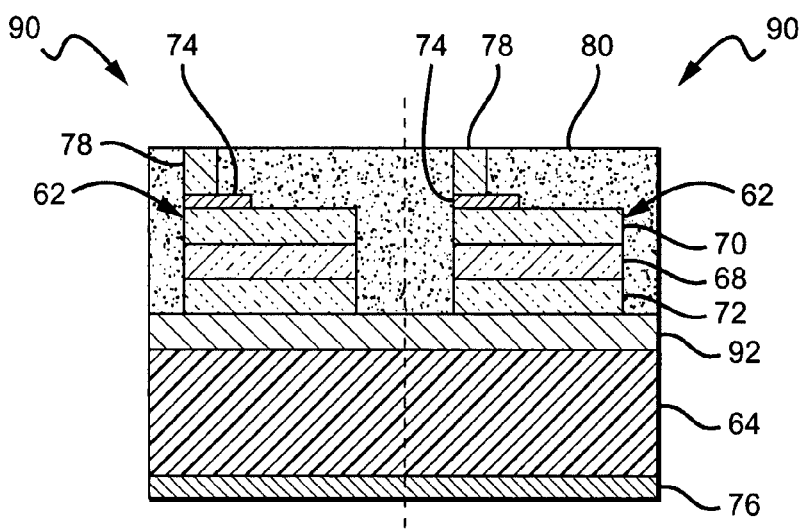
FIG. 4 is a sectional view of another embodiment of an LED chip wafer according to the present invention having a reflective layer.

The flip-wafer bonded LEDs can also have reflective elements or layers to encourage light emission in the desired direction. FIG. 4 shows LED chips 90 at the wafer level that are similar to the LED chips 60 shown in FIGS. 3a through 3e and described above. For similar features the same reference numbers are used herein, and although LED chips 90 are shown having vertical geometry LEDs 62, it is understood that lateral geometry LEDs can also be used. The LED chips 90 comprise LEDs 62 mounted to a substrate 64 that can either be a carrier or growth substrate. Each of the LEDs 62 comprises an active layer 68, n-type layer 70, p-type layer 72, p-type contact 76, n-type contact 74, and pedestal 78 as described above, and a phosphor loaded binder coating 80 is formed over the LEDs also as described above. In this embodiment, however, a reflective layer 92 is included between the LEDs 62 and the substrate 64 that can comprise a highly reflective metal or reflective semiconductor structures such as a DBR. The reflective layer 92 reflects LED light that is emitted toward the substrate 64 and helps prevent light from passing into the substrate where at least some of the light can be absorbed by the substrate 64. This also encourages light emission from the LED chips 90 toward the top of the LED chips 90. It is understood that a bond/metal layer (not shown) can also be included below the reflective layer or in other locations, particularly in the embodiments where the substrate 64 is a carrier substrate. The LED chips 90 can also comprise a p-contact layer adjacent to the p-type layer 72 to encourage ohmic contact to the layers below.

Figure 5A:
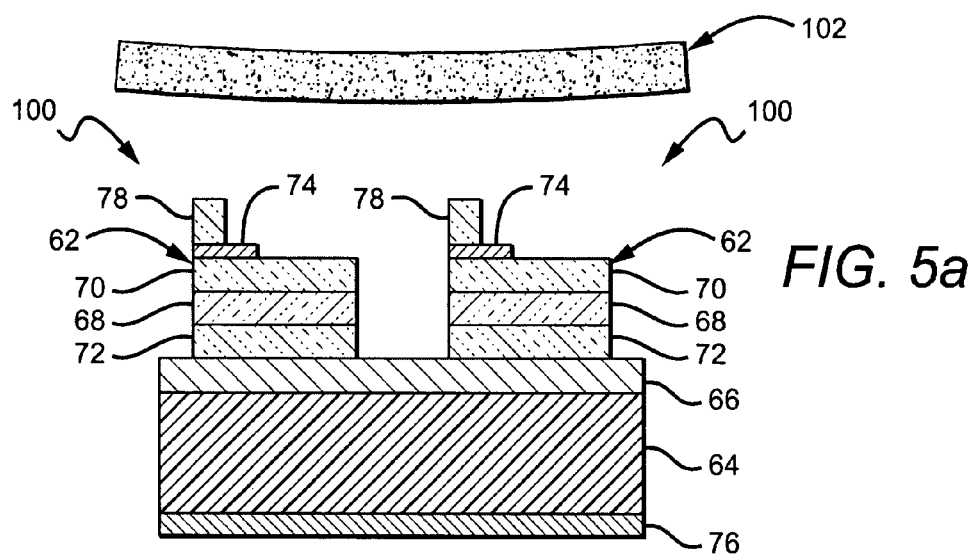
FIGS. 5a through 5d are sectional views of another embodiment of an LED chip wafer at fabrication steps in a method according to the present invention utilizing a prefabricated coating.

FIGS. 5a through 5d show another embodiment of LED chips 100 fabricated according to the present invention that are similar to the LED chips 60 described above and shown in FIGS. 3a through 3e. It is understood, however, that this method can also be used with non flip-wafer bonded embodiments such as the embodiment described above and shown in FIGS. 1a through 1e. Referring first to FIG. 5a, the LED chips 100 comprise vertical LEDs 62 mounted to a substrate 64 that in this case is a carrier substrate. It is understood that lateral LEDs can also be used as described above. Each of the LEDs 62 comprises active layer 68, n-type layer 70, p-type layer 72, p-type contact 76, n-type contact 74, and pedestal 78 as described above. For LED chips 100, however, are covered by a prefabricated coating layer 102 that can have the phosphor (and other) materials described above fixed in a binder also made of the materials described above.

Figure 5B:
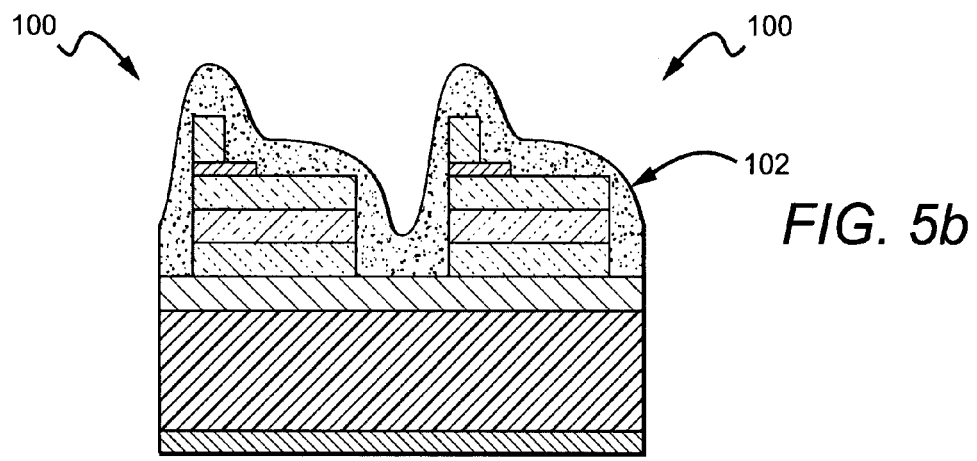

Referring now to FIG. 5b, the layer 102 is placed over and covering the LEDs 62 and their pedestals 78 to provide a conformal coating. In one embodiment a bonding material can be included between the layer 102 and the LED chips 100 for adhesion, with typical adhesives being used such as silicones or epoxies. To further encourage conformal coating, the layer 102 can be heated or a vacuum can be applied to pull the layer 102 down over the LED chips 100. The layer 102 can also be provided in a state where the binder is not fully cured so that the layer 102 more readily conforms to the LED chips. Following conformal placement of the layer 102, the binder can be exposed to its final curing.

Figure 5C:
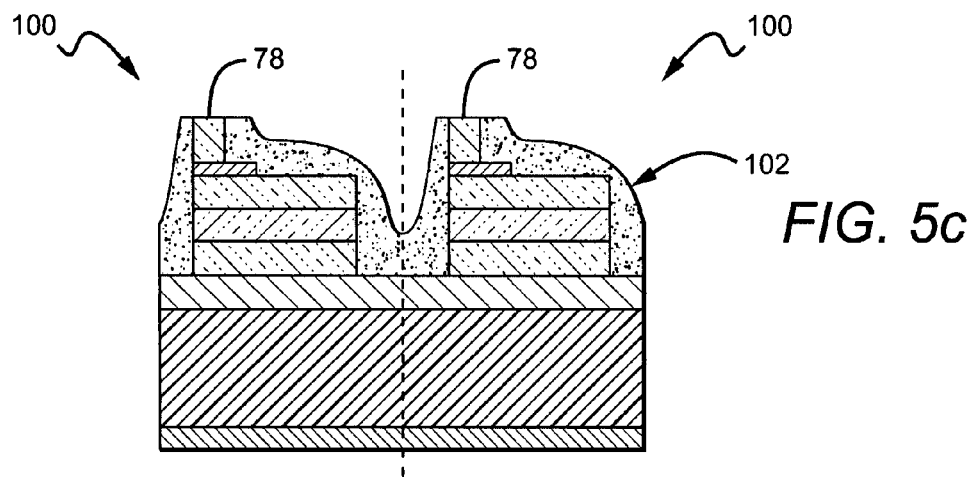
Figure 5D:
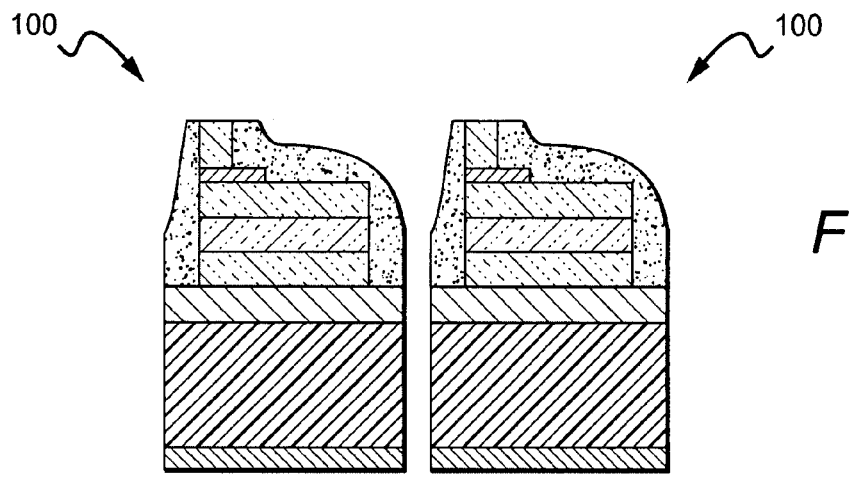

Referring now to FIG. 5c, the layer 102 can be planarized using the methods described above to expose the pedestals 78, making them available for contacting. As shown in FIG. 5d, the LED chips 100 can then be singulated using the methods described above.

The fabrication method for LED chips 100 allows for the thickness of the phosphor/binder to be accurately controlled by controlling the thickness of the layer 102. This method also allows for the use of different layer thicknesses and composition for different desired emission characteristics for the LED chips 100.

Figure 6A:
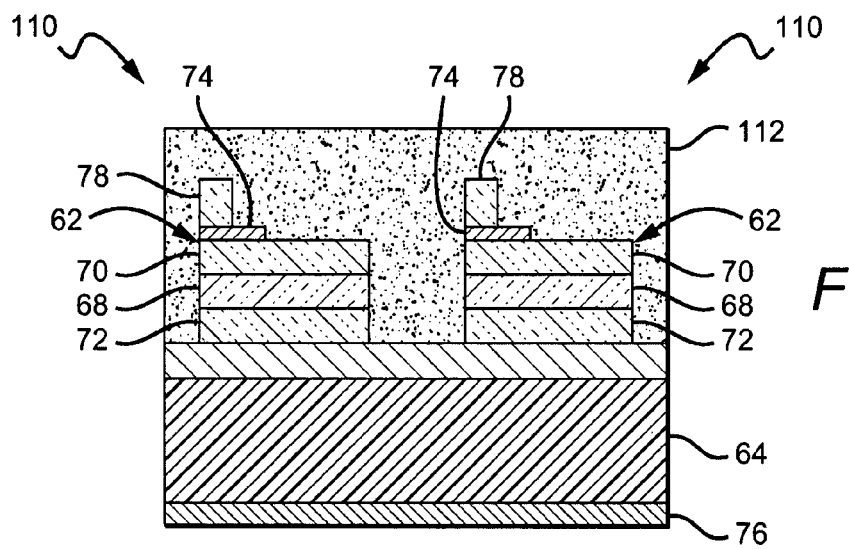
FIGS. 6a through 6c are sectional views of another embodiment of an LED chip wafer at fabrication steps in a method according to the present invention having recesses in the coating.
Figure 6B:
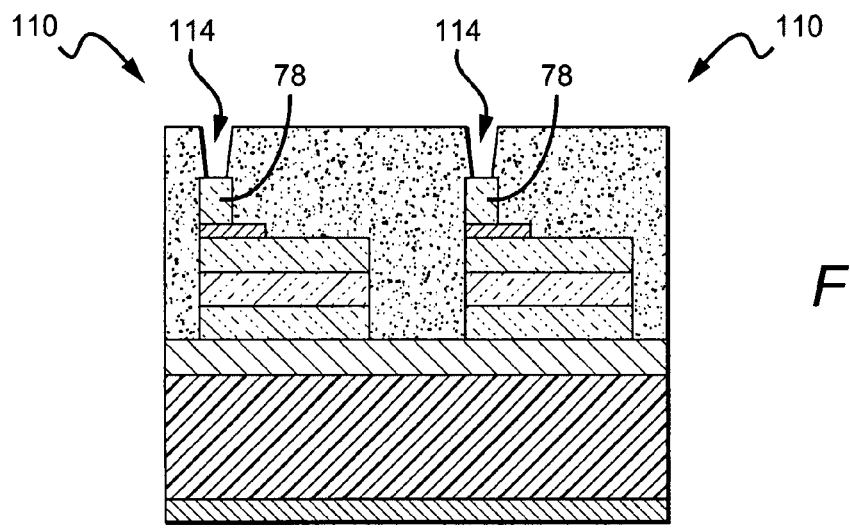
Figure 6C:
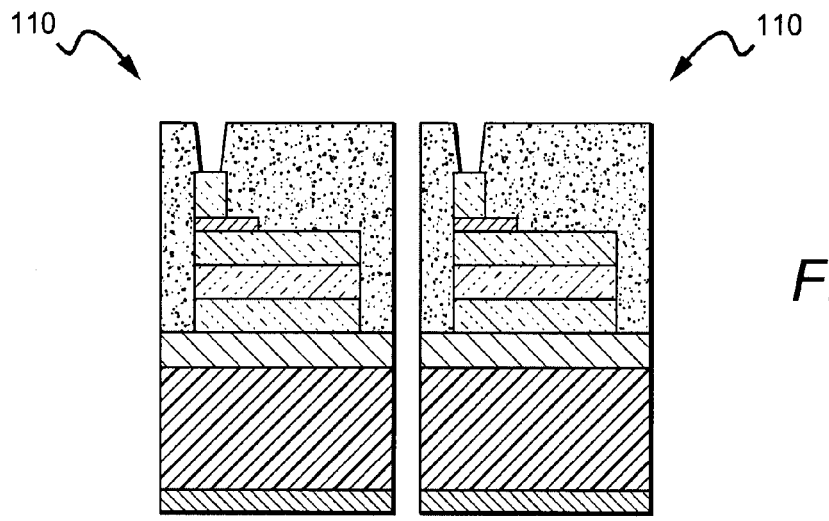

FIGS. 6a through 6c show still another embodiment of LED chips 110 according to the present invention similar to LED chips 60. Referring first to FIG. 6a, each of the LED chips 110 has vertical LEDs 62 mounted to a substrate 64 that can either be a carrier or growth substrate. Each of the LEDs 62 comprises active layer 68, n-type layer 70, p-type layer 72, p-type contact 76, n-type contact 74, and pedestal 78 as described above. A coating 112 made of the materials described above is included over the LEDs 62, burying the pedestals 78.

Referring to FIG. 6b, in this embodiment the coating 112 is not planarized to expose the pedestals 78. Instead, the coating remains at a level higher than the pedestals and a portion of the coating 112 burying the pedestal 78 is removed leaving recessed portions 114 in the coating 112. The pedestals 78 are exposed through the recessed portions 114 for contacting. Many different methods can be used to remove the coating such as conventional patterning or etching processes. Referring now to FIG. 6c, the LED chips 110 can then be singulated using the methods described above.

This method of forming recessed portions 114 can be used in conjunction with planarizing of the coating 112. The layer 112 can be planarized to the level that provides the desired emission characteristics of the LED chip 110, which may be above the pedestals 78. The recessed portions 114 can then be formed to access the pedestals. This allows for forming pedestals of reduced height lower than the coating, which can reduce fabrication costs related to forming the pedestals 78. This process can require some alignment with forming the recessed portions, but the coating 112 is still applied without the need for alignment.

Figure 7:
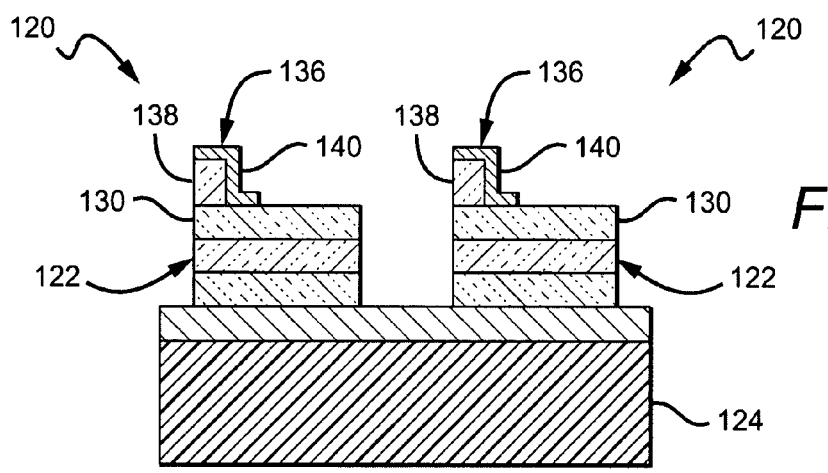
FIG. 7 is a sectional view of another embodiment of an LED chip wafer according to the present invention.

The pedestals in the LED chips embodiments above are described as comprising a conductive material such as Au, Cu, Ni or In, preferably formed using stud bumping processes. Alternatively, the pedestals can be made of different materials and can be formed using different methods. FIG. 7 shows another embodiment of LED chips 120 comprising LEDs 122 flip-wafer bonded on a carrier substrate 124. In this embodiment, the pedestal 136 comprises a semiconductor material 138 formed generally in the shape of a pedestal 136. The semiconductor material 138 can be on the first contact, or as shown can be on the first epitaxial layer 130. A pedestal layer 140 of conductive material is included on the top surface of the semiconductor material 138 and extending to the top surface of the first epitaxial layer 130 and forming an n-type contact.

The semiconductor material 138 can be formed in many different ways and can comprise many different materials, such as the material comprising the LED epitaxial layers or the growth substrate material, e.g. GaN, SiC, sapphire, Si, etc. In one embodiment, the semiconductor material 138 can be etched from the epitaxial layers, and then coated with the pedestal layer 140. In other embodiments, portions of the growth substrate can remain on the epitaxial layers during removal of the growth substrate from the LEDs 122. The remaining growth substrate portions can then be covered by the pedestal layer 140.

Figure 8:
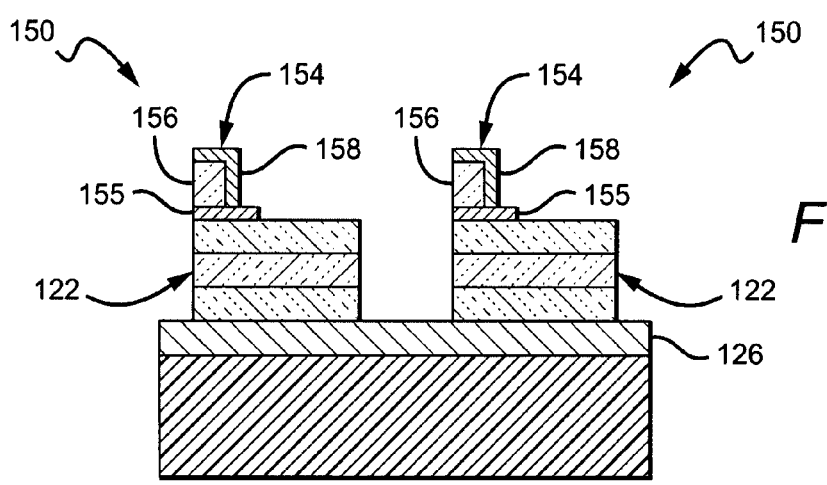
FIG. 8 is also a sectional view of another embodiment of an LED chip wafer according to the present invention.

FIG. 8 shows another embodiment of LED chips 150 still in wafer form that are similar to the LED chips 120 in FIG. 7, and the same reference numbers are used for similar features herein. The LED chips 150 comprise LEDs 122 flip-wafer bonded on a carrier substrate 124 by bond/metal layer 126. A pedestal 154 is formed on each of the LEDs 122, preferably on the n-type contact 155. The pedestal 154 comprises a patternable material 156 in substantially the shape of the pedestal 154 that is covered with a pedestal layer 158 of conductive material that extends to the first contact 152. The patternable material 156 can comprise different materials compatible with LED fabrication and operation such as BCB, polymides and dielectrics. These materials can be formed on the LEDs 112 using known processes. Alternatively, pedestal 154 can be formed using patternable and electrically conducting materials such as silver epoxy or printable inks, in which case layer 158 may not be required. Other methods and approaches for fabricating pedestals can be used, some of which are described in John Lau, "Flip-Chip Technologies", McGraw Hill, 1996.

Like the embodiments above, the wafer comprising the LED chips 120 and 150 can be blanketed by a layer of coating material, burying the LED chips and their pedestals. The coating material can comprise the phosphors and binders described above, and can be thinned using the methods described above to expose the pedestals through the coating materials. The LED chips can then be singulated using the methods described above.

The present invention can also be used to fabricate wafer level emitter arrays. FIG. 9 shows one embodiment of wafer level LED array 170 that comprises LEDs 172 flip-wafer bonded on a carrier substrate 174 by a bond/metal layer 176. The LEDs comprise an active region 178 between first and second epitaxial layers 180, 182 with a first contact 184 on the first epitaxial layer 180. A pedestal 186 is included on the first contact 184 and a coating 188 of phosphor loaded binder coating blankets the LEDs 172, contacts 184 and pedestals 186, with the coating being thinned to expose the top of the pedestals 186. For the LED array 170 however, the individual LED chips are not singulated. Instead, an interconnecting metal pad 190 is included on the surface of the LED 172, interconnecting the exposed tops of the pedestals 186 in a parallel fashion. An electrical signal applied to the metal pad 190 conducts to the LEDs having their pedestals 186 coupled to the metal pad 190, illuminating the LEDs in an array. It is understood that the LED array can comprise many different numbers of LEDs arranged in different ways, such as in a row or block, depending on the LEDs that are interconnected by the metal pad 190.

FIG. 10 shows another embodiment of an LED array 200 according to the present invention also having LEDs 202 flip-wafer bonded to a carrier substrate 204, with each of the LEDs 202 comprising an active region 208 between first and second epitaxial layers 210, 212. A first contact 214 is on the first epitixial layer 210 with a pedestal 216 formed on the first contact 214. A phosphor loaded binder coating 218 is included over the LEDs 202, first contacts 214 and pedestals 216, with the top surface of the pedestals 216 exposed. The LEDs 202 are mounted to the carrier substrate 204 by an electrically insulating bond layer 220 and a p-contact 222 is between each of the LEDs 202 and the insulating bond layer 220. Conductive vias 224 run between the p-contact and the surface of the coating 218 between the LEDs 202, and respective metal pads 226 run on the surface of the coating 118 between each of the posts 224 and a respective adjacent pedestal 216. This arrangement provides for a conductive path between the LEDs 202 such that the LEDs 202 are connected in series array, with the conductive path between the LEDs isolated from the substrate by the insulating bond layer 220. An electrical signal applied to the metal pads runs through each of the LEDs causing them to emit light in an array. It is understood that the LED array 200 can comprise many different numbers of LEDs arranged in different ways, such as in a row or block, depending on the LEDs that are interconnected by the metal pads 226.

Figure 11:
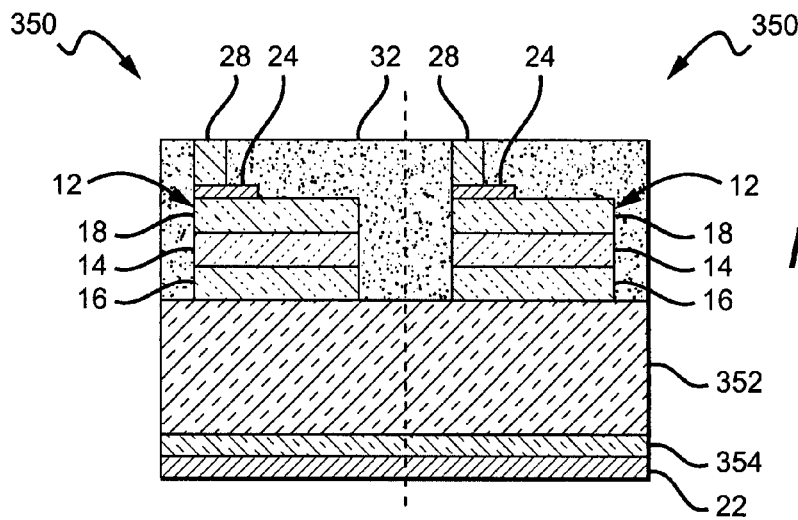
FIG. 11 is a sectional view of an embodiment of an LED chip wafer according to the present invention having a transparent substrate.

Many different LED chips having different structures can be fabricated according to the present invention. FIG. 11 shows another embodiment of LED chips 350 according to the present invention arranged similarly to the LED chips 10 shown in FIGS. 1a through 1e and described above, and for similar features the same reference numbers are used herein. The LED chips 350 have vertical geometry and comprise LEDs 12 each of which comprise an active region 14 between n-type and p-type epitaxial layers 16, 18. A pedestal 28 is formed on the p-type contact 24 with a phosphor loaded binder coating 32 covering the LEDs 12. In this embodiment however, the LEDs 12 are on a transparent substrate 352, which allows for a reflective layer 354 to be formed on the substrate 352 opposite the LEDs 12. Light from the LEDs 12 can pass through the substrate 352 and reflect back from the reflective layer 354 while experiencing minimal losses. The reflective layer 354 is shown between the contact 22 and the substrate 352, but it is understood that the reflective layer 354 can be arranged differently, such as being the bottommost layer with the contact 22 between the reflective layer 354 and the substrate 352.

Figure 12:
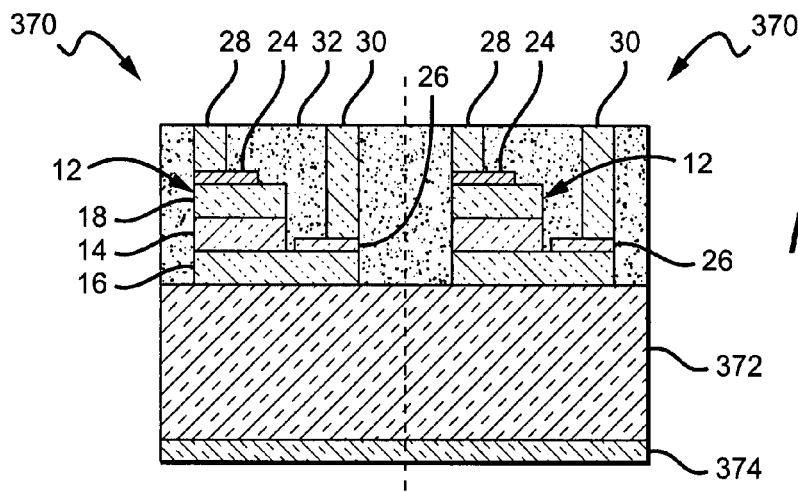
FIG. 12 is a sectional view of another embodiment of an LED chip wafer according to the present invention having a transparent substrate.

FIG. 12 also shows another embodiment of LED chips 370 according to the present invention also arranged similar to the LED chips in FIGS. 1a through 1e. The LED chips 370 in this embodiment have lateral geometry and comprise LEDs 12 each of which comprise an active region 14 between n-type and p-type epitaxial layers 16, 18. A portion of the p-type layer 18 and the active region 14 is etched to reveal the n-type layer 16, with p-type contact 24 on the p-type layer 18 and the n-type contact 26 on the n-type layer 16. A p-type pedestal 28 is on the p-type contact 24 and n-type pedestal 30 is on the n-type contact 26. A phosphor loaded binder coating 32 covers the LEDs 12 with the pedestals 28, 30 exposed through the coating 32. The LEDs 12 are on a transparent substrate 372 and a reflective layer 374 included on the substrate 372 opposite the LEDs 12. The LEDs 12 have a lateral geometry with an p-type contact 24 and p-type pedestal 28 on the top of each of the LEDs 12. The reflective layer 374 also reflects light from the LEDs with the light experiencing minimal loss through the substrate 372.

Figure 13:
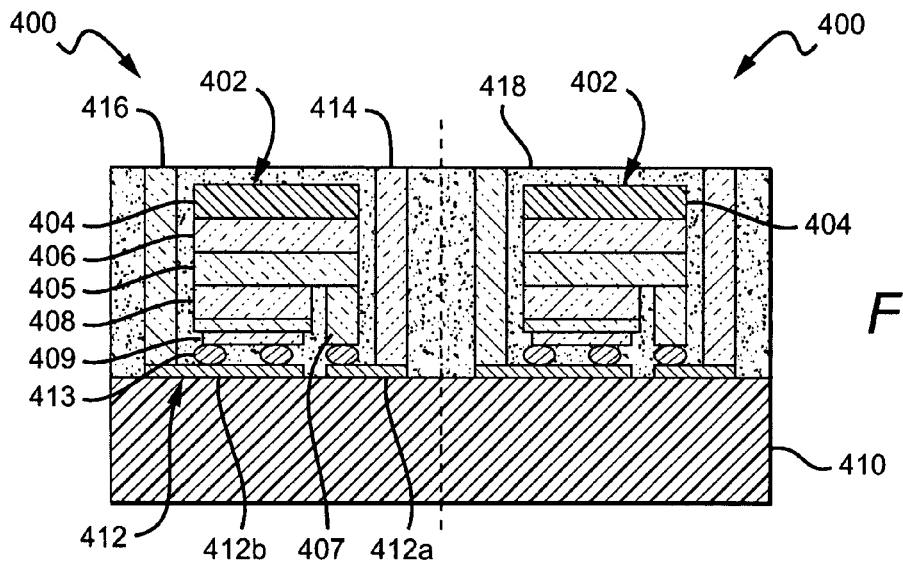
FIG. 13 is a sectional view of another embodiment of an flip-chip LED chip wafer according to the present invention.

Many different variations to the LED chips can be fabricated according to the present invention and FIG. 13 shows another embodiment of LED chips 400 having LEDs 402 having an active region 405 between n- and p-type layers 406, 408, on a growth substrate 404. It is understood that the LEDs 402 can also be provided with the growth substrate thinned or after the growth substrate has been removed. The LEDs also have n-type and p-type contacts 407, 409. The LEDs 402 are diced or singulated and flip-chip bonded to a submount/carrier wafer 410. Conductive traces 412 are formed on the submount/carrier wafer 410 with each of the LEDs 402 mounted on the traces 412, with the first trace 412a in electrical contact with the n-type layer 406 and the second trace 412b in contact with the p-type layer 408. Conventional traces can be used comprising aluminum (Al) or Au deposited using known techniques such as sputtering. The LED 402 is mounted to the traces 412 by flip-chip bonds 413 that can be arranged in conventional ways using known materials such as Au, or gold/tin solder bumps or stud bumps.

It is further understood that the pedestals in FIG. 13, and in the embodiments discussed above and below, can also be made of an insulating material coated by a conductive layer. In one embodiment, the pedestals can comprise substrate material or submount/carrier wafer materiel. For the LED chips 400, the submount/carrier wafer can be fabricated with pedestals with each of the LEDs mounted between pedestals. A conductive layer can be formed over the pedestals in contact with the conductive traces or in contact with the LED using other arrangements. It is further understood that the pedestals can have many different shapes and sizes, and in one embodiment can comprise a reflective cup with an LED mounted within the cup. The cup can be coated with a conductive layer in contact with the conductive traces or the LED using other arrangements. During planarization of the phosphor binder coating, the top of the cups can be exposed for contacting. In still other embodiments, the cup can have its own pedestals that can be exposed during planarization.

An n-type pedestal 414 is formed on the first trace 412a and a p-type pedestal 416 is formed on the second trace 412b, with both pedestals being formed using the methods described above. A phosphor/binder coating 418 is included over the LEDs 402, burying the pedestals 414, 416. The coating 418 can then be planarized to expose the pedestals 414, 416 for contacting, or in other embodiments the recesses can be formed in the coating to expose the pedestals 414, 416. The LED chips can then be singulated using the processes described above.

The fabrication method described in conjunction with LED chips 400 allows for the use of good quality singulated LEDs 402 with the desired emission characteristics to be selected for mounting to the wafer 404. The arrangement also allows for the mounting of LEDs 402 to the wafer with larger spaces between the LEDs 402 while not wasting valuable epitaxial material through etching of the material to form the spaces.

Figure 14:
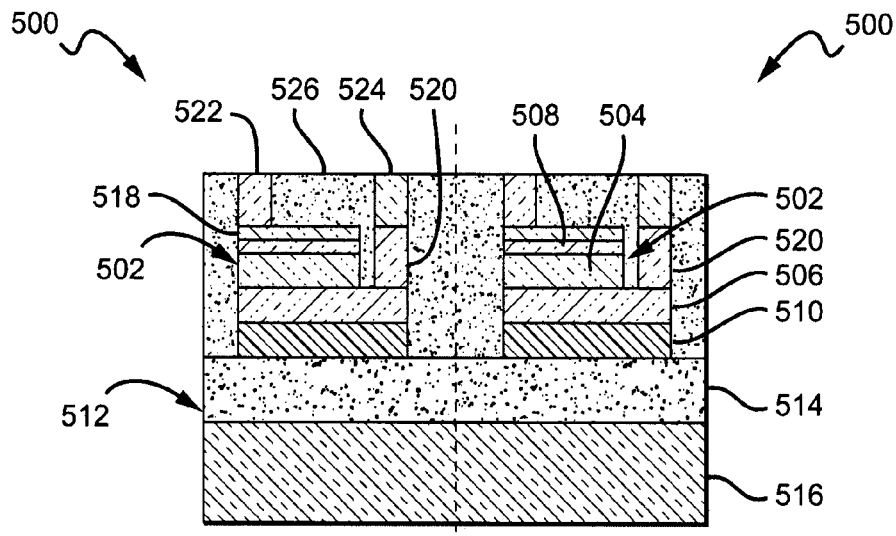
FIG. 14 is a sectional view of another embodiment of an LED chip having a phosphor loading carrier substrate.

FIG. 14 shows still another embodiment of LED chips 500 according to the present invention having singulated lateral geometry LEDs 502 mounted to a carrier substrate. Each of the LEDs 502 comprises an active region 504 between n- and p-type layers 506, 508, all formed successively on a growth substrate 510. The substrate 510 can be many different materials, with the preferred substrate being a transparent material such as sapphire. The LEDs 502 are singulated with at least a portion of the growth substrate 510 remaining.

The LEDs 502 are then mounted to a carrier substrate 512 with the substrate down. The carrier substrate 512 comprises a first phosphor/binder coating 514 on a transparent substrate 516. The first coating 514 can be adhesive to hold the LEDs 502 or an additional adhesive materials can be used.

A p-type contact 518 is provided on the p-type layer 508 and an n-type contact 520 is provided on the n-type layer 506. The contacts 518, 520 can comprise many different materials, with the preferred material being reflective. By being reflective, the contacts 518, 520 reflect active region light making the carrier substrate 512 the primary emission surface. P-type pedestal 522 is formed on the p-type contact 518, and n-type pedestal 524 is formed on the n-type contact 520 as described above. A second phosphor/binder coating 526 is formed over the LEDs 502, burying the pedestals 522, 524. As described above, the second coating 526 can then be planarized to reveal the pedestals 522, 524.

The LED chips 500 can then be singulated and this arrangement provides LED chips 500 having LEDs 502 that are surrounded by a phosphor layer provided by the first and second coating 514, 526. The singulated LED chips 500 can also be packaged as a conventional flip-chip device except with the first and second coatings providing a white-emitting LED flip chip without further phosphor processing. This embodiment provides the further advantage of ability to use good quality singulated LEDs 502 with the desired emission characteristics for mounting to the wafer carrier wafer 512, such that the resulting LED chips 502 are of good quality. The LEDs 502 can also be mounted to the wafer with larger spaces between the LEDs 502 while not wasting valuable epitaxial material through etching of the material to form the spaces.

Figure 15A:
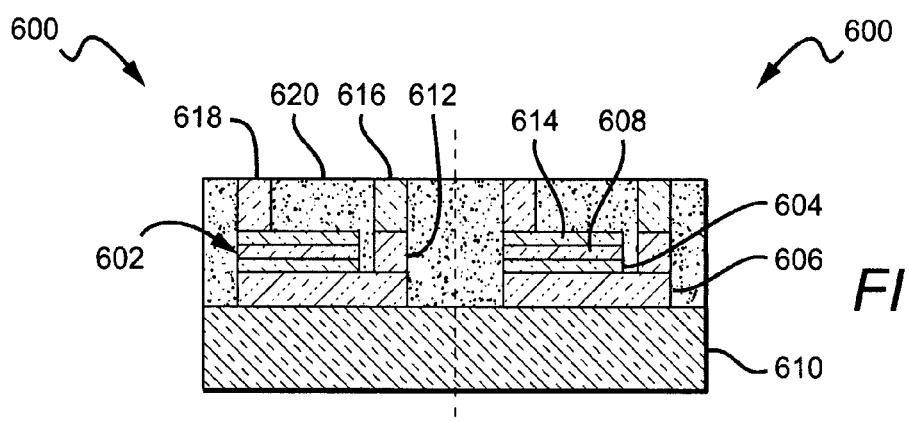
FIGS. 15a through 15d are sectional views of another embodiment of an LED chip wafer at fabrication steps in a method according to the present invention utilizing a trenched substrate.

FIGS. 15a through 15d show still another embodiment of LED chips 600 according to the present invention. Referring first to FIG. 15a, each of the LED chips comprises LEDs 602 each of which has an active region 604 between n- and p-type layers 606, 608, all formed successively on a growth substrate 610 that is preferably a transparent material such as sapphire. The LEDs 602 have a lateral geometry with a reflective n-type contact 612 on the n-type layer 606 and a reflective p-type contact 614 on the p-type layer 608. An n-type pedestal 616 is formed on the n-type contact 612, and a p-type pedestal 618 is formed on the p-type contact 614. A first phosphor/binder coating 620 is provided over the LEDs 602, initially burying the pedestals 616, 618, with coating then planarized to reveal the pedestal.

Figure 15B:
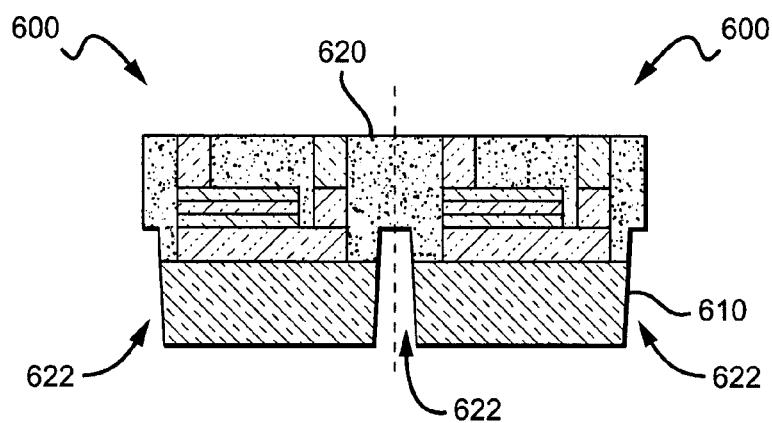
Figure 15C:
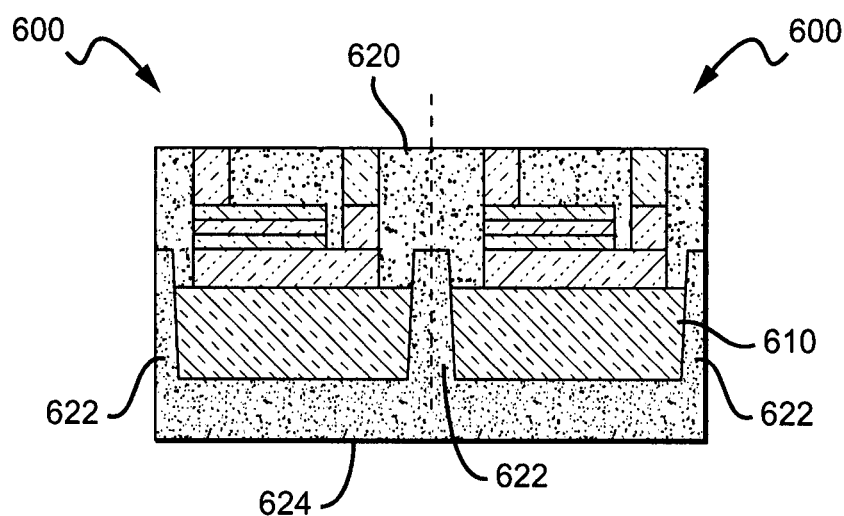
Figure 15D:
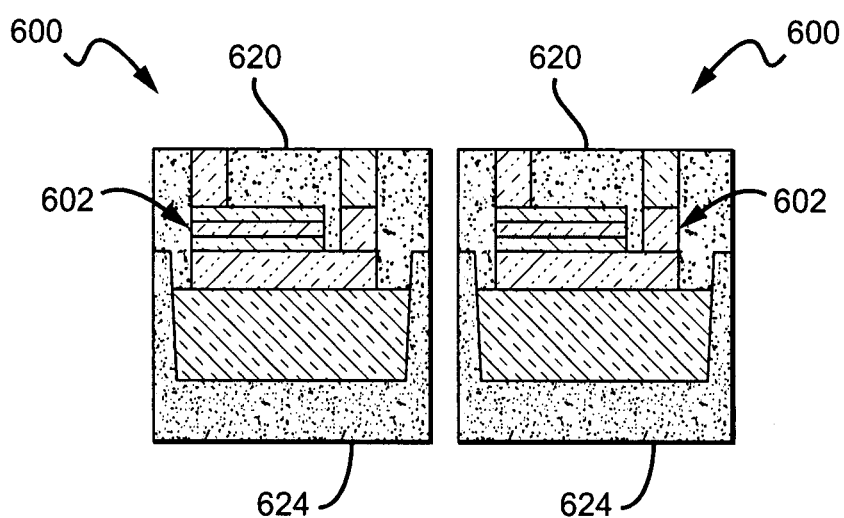

Referring now to FIG. 15b, trenches 622 are formed through the substrate 610 and partially into the coating 620, with the trenches arranged between the LEDs 602. The trenches 622 can be formed using many different methods such as by etching or cutting. Referring now to FIG. 15c, a second phosphor/binder coating 624 can be formed over the trench side of the substrate 610, filling the trenches 622. The second coating can then be planarized as desired. Referring to FIG. 15d, the LED chips 600 can be singulated with the LEDs 602 being surrounded by a phosphor layer provided by the first and second coatings 620, 624. The LED chips 600 provide similar advantages as the LED chips 500 in FIG. 14, and provides good quality flip-chip devices that can provide white light emission without additional phosphor processing.

Referring again to FIGS. 15a and 15b, as an alternative to forming trenches 622, the growth substrate 610 can be removed entirely to expose the bottom surface of the n-type layer 606. The second phosphor/binder coating 624 can then be formed over the exposed n-type layer, and planarized as desired.

The present invention can also be used to cover individual LEDs instead of those on formed in an LED chip wafer. In these embodiments, the LED chips can be singulated and then mounted in a package or to a submount or PCB. The LED chips can then be coated and planarized according to the present invention to expose the pedestal(s) for contacting.

Although the present invention has been described in detail with reference to certain preferred configurations thereof, other versions are possible. Therefore, the spirit and scope of the invention should not be limited to the versions described above.

We claim:

1. A light emitting diode (LED) chip wafer, comprising:
   a plurality of vertical geometry LEDs formed at the wafer level on a substrate wafer, each LED in said plurality of LEDs comprising a plurality of semiconductor layers;
   a plurality of pedestals, each of which is in electrical contact with one of said LEDs, said plurality of pedestals disposed such that at least two pedestals are on one side of each of said LEDs; and
   a coating at least partially covering said LEDs and directly on the top surface of said LEDs, at least some of said pedestals extending through and to the surface of said coating with the top surface of said pedestals exposed at the same level as the top surface of said coating, said coating having substantially the same index of refraction from the top surface of said semiconductor layers to the top surface of said coating;
   wherein said coating comprises a phosphor loaded binder.

2. The LED chip wafer of claim 1, wherein said substrate wafer comprises a growth substrate wafer.

3. The LED chip wafer of claim 2, wherein said substrate comprises a phosphor loaded binder layer.

4. The LED chip of claim 1, wherein said substrate wafer is capable of being separated into LED chips.

5. The LED chip wafer of claim 1, wherein said coating has a uniform thickness.

6. The LED chip wafer of claim 1, wherein said coating has a total thickness variation of <50% of the average coating thickness.

7. The LED chip wafer of claim 1, wherein said coating has a textured surface.

8. The LED chip wafer of claim 1, wherein said coating comprises multiple phosphors.

9. The LED chip wafer of claim 1, wherein said coating comprises scattering particles.

10. The LED chip wafer of claim 1, wherein said binder comprises one of the materials from the group consisting of silicone, epoxy, glass, spin-on glass, BCB, polymides and polymers.

11. The LED chip wafer of claim 1, wherein said phosphor comprises YAG:Ce.

12. The LED chip wafer of claim 1, wherein said pedestals comprise one or more stud bumps.

13. The LED chip wafer of claim 1, wherein said LEDs are made of materials from the Group-III nitride material system.

14. The LED chip wafer of claim 1, wherein said substrate wafer comprises a carrier substrate.

15. The LED chip wafer of claim 1, wherein said LEDs are interconnected in an LED array.

16. The LED chip wafer of claim 1, a metal pad on the surface of said coating interconnecting at least some of said exposed pedestals to form an LED array.

17. The LED chip wafer of claim 1, further comprising a reflective layer formed integral to said substrate wafer.

18. The LED chip wafer of claim 1, wherein said LEDs comprise at least a portion of a growth substrate.

19. The LED chip wafer of claim 1, wherein said LEDs are provided on a substrate, further comprising trenches in said substrate and a second coating filling said trenches.

20. The LED chip wafer of claim 1, wherein said coating comprises multiple layers with different compositions.

21. The LED chip wafer of claim 1, further comprising the step of forming a second coating around at least part of said LEDs.

22. The LED chip wafer of claim 21, wherein said second coating has a different composition than said coating.

23. The LED chip wafer of claim 1, said LED chip wafer capable of emitting white light from said LEDs and coating.

24. A light emitting diode (LED) chip wafer, comprising:
   a plurality of vertical geometry LEDs formed at the wafer level on a substrate wafer, each LED in said plurality of LEDs comprising a plurality of semiconductor layers;
   a plurality of pedestals, each of which is in electrical contact with one of said LEDs, said plurality of pedestals disposed such that at least two pedestals are on one side of each of said LEDs; and
   a coating at least partially covering said LEDs and directly on the top surface of said LEDs, at least some of said pedestals extending through and to the surface of said coating with the top surface of said pedestals exposed at the same level as the top surface of said coating, said coating having substantially the same index of refraction from the top surface of said semiconductor layers to the top surface of said coating;

wherein said coating comprises scattering particles.

* * * * *